(12) United States Patent
Takizawa et al.

(10) Patent No.: US 11,037,830 B2
(45) Date of Patent: Jun. 15, 2021

(54) METHOD OF MANUFACTURING SEMICONDUCTOR DEVICE

(71) Applicant: RENESAS ELECTRONICS CORPORATION, Tokyo (JP)

(72) Inventors: Naoki Takizawa, Tokyo (JP); Tatsuyoshi Mihara, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/601,234

(22) Filed: Oct. 14, 2019

(65) Prior Publication Data

US 2021/0111256 A1   Apr. 15, 2021

(51) Int. Cl.

| H01L 21/8234 | (2006.01) |
| H01L 21/28 | (2006.01) |
| H01L 29/66 | (2006.01) |
| H01L 27/1157 | (2017.01) |
| H01L 27/11573 | (2017.01) |
| H01L 21/306 | (2006.01) |
| H01L 29/423 | (2006.01) |

(52) U.S. Cl.
CPC ........... *H01L 21/823462* (2013.01); *H01L 21/30604* (2013.01); *H01L 21/82345* (2013.01); *H01L 21/823437* (2013.01); *H01L 27/1157* (2013.01); *H01L 27/11573* (2013.01); *H01L 29/40117* (2019.08); *H01L 29/42344* (2013.01); *H01L 29/66833* (2013.01)

(58) Field of Classification Search
CPC ........... H01L 29/40117; H01L 29/4234; H01L 29/42344; H01L 29/66833; H01L 29/792; H01L 27/11531; H01L 27/11543; H01L 27/11546; H01L 27/1157; H01L 27/11563; H01L 27/11573; H01L 21/823437; H01L 21/82345; H01L 21/823418; H01L 21/823462; H01L 21/823468; H01L 21/30604
See application file for complete search history.

(56) References Cited

U.S. PATENT DOCUMENTS

| 8,951,869 B2 | 2/2015 | Tsukamoto et al. | |
| 2007/0145455 A1* | 6/2007 | Yasui | H01L 27/11568 257/314 |
| 2008/0185635 A1* | 8/2008 | Yanagi | H01L 27/11521 257/325 |
| 2008/0290401 A1* | 11/2008 | Yasui | H01L 29/792 257/324 |
| 2012/0299084 A1* | 11/2012 | Saito | H01L 29/40117 257/324 |

(Continued)

FOREIGN PATENT DOCUMENTS

| JP | 2008-211016 A | 9/2008 |
| JP | 2014-154790 A | 8/2014 |

*Primary Examiner* — Eduardo A Rodela
(74) *Attorney, Agent, or Firm* — McDermott Will & Emery LLP

(57) ABSTRACT

After the step of polishing, a part of each of each gate electrode is removed such that the upper surface of each gate electrode is located closer than the damaged region formed in the gate insulating film located between the gate electrodes to the main surface of the semiconductor substrate in cross-section view. Thus, it is possible to suppress the occurrence of a short-circuit defect during the operation of the semiconductor device.

17 Claims, 18 Drawing Sheets

(56) References Cited

U.S. PATENT DOCUMENTS

| | | | |
|---|---|---|---|
| 2014/0227843 A1* | 8/2014 | Tsukamoto | H01L 27/11568 438/275 |
| 2014/0302646 A1* | 10/2014 | Hirano | H01L 29/42344 438/197 |
| 2016/0043098 A1* | 2/2016 | Nakanishi | H01L 27/11563 438/283 |
| 2016/0064389 A1* | 3/2016 | Mihara | H01L 29/792 257/314 |
| 2016/0099358 A1* | 4/2016 | Kawashima | H01L 29/792 438/287 |
| 2017/0069648 A1* | 3/2017 | Yamaguchi | H01L 21/28518 |

* cited by examiner

FIG. 18

| APPLIED VOLTAGE / OPERATION | Vd | Vcg | Vmg | Vs | Vb |
|---|---|---|---|---|---|
| WRITING | 1.5V | 1V | 12V | 6V | 0V |
| ERASING | 0V | 0V | -6V | 6V | 0V |
| READING | 1.5V | 1.5V | 0V | 0V | 0V |

METHOD OF MANUFACTURING SEMICONDUCTOR DEVICE

BACKGROUND

The present invention relates to a method of manufacturing a semiconductor device, and the present invention can be suitably used, for example, in the method of manufacturing a semiconductor device having a non-volatile memory.

A storage device typified by a flash memory, which is widely used as an electrically writable and erasable non-volatile semiconductor memory device, has a conductive floating gate electrode or a trapping insulating film sandwiched by an oxide film, below a gate electrode comprising a MISFET. Then, the charge accumulation state in the floating gate electrode or the trapping insulating film is used as storage information, which is read out as a threshold value of the transistor. Here, the trapping insulating film refers to an insulating film capable of accumulating charges, and as an example, a silicon nitride film can be given. By injecting and discharging charges into and from the insulating film, the MISFET thresholds are shifted to operate as memory elements.

As the flash memory, for example, there is a flash memory having a SG-MONOS (Split Gate type Metal Oxide Nitride Oxide Semiconductor) structure as disclosed in Japanese Unexamined Patent Application Publication No. 2008-211016 and Japanese Unexamined Patent Application Publication No. 2014-154790. In such a memory, since a silicon nitride film is used as a charge storage region and charges are accumulated discretely, the reliability of data retention is superior to that of a conductive floating gate electrode. In addition, since the reliability of data retention is excellent, the thickness of the oxide film located above and below the silicon nitride film can be reduced, thereby making it possible to lower the voltage value required for the data write/erase operation.

The present inventor has studied further miniaturization of the semiconductor device so that the respective operations such as "writing", "reading" and "erasing" of data can be performed at high speed with respect to the split-gate type nonvolatile memories as shown in Japanese Unexamined Patent Application Publication No. 2008-211016 and Japanese Unexamined Patent Application Publication No. 2014-154790. When the semiconductor device is further miniaturized, it has been found that a short-circuit defect may occur between two gate electrodes comprising the memory cell of the split-gate nonvolatile memory.

Other objects and novel features will become apparent from the description of this specification and the accompanying drawings.

The typical ones of the embodiments disclosed in the present application will be briefly described as follows.

The method of manufacturing the semiconductor device in one embodiment includes the step of removing a part of each of the first gate electrode and the second gate electrode such that an upper surface of each of the first gate electrode and the second gate electrode is located closer than a damaged region formed in the second gate insulating film located between the first gate electrode and the second gate electrode to the first main surface of the semiconductor substrate, in cross-section view.

According to the method of manufacturing the semiconductor device in the embodiment, it is possible to suppress the occurrence of a short-circuit defect during the operation of the semiconductor device.

BRIEF DESCRIPTION OF THE DRAWINGS

FIG. 18 is a table showing an example of voltage values applied to each part of the selected memory cell in "write", "erase" and "read".

DETAILED DESCRIPTION

Figure 1:
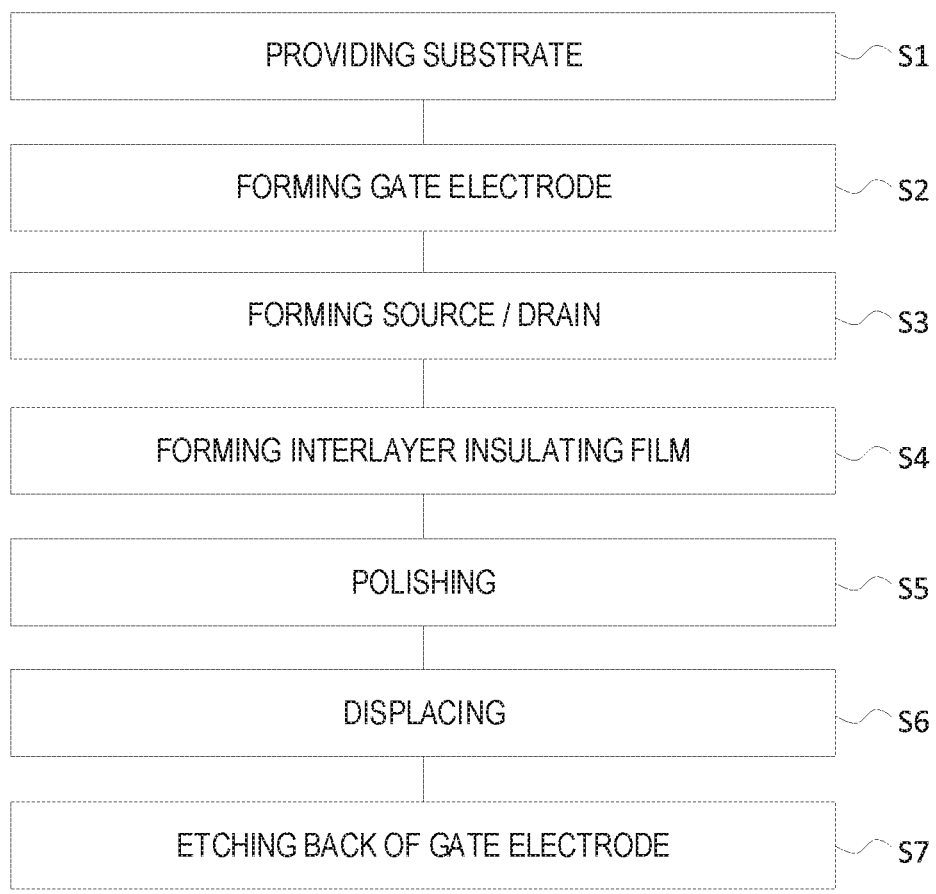
FIG. 1 is a process flow diagram showing a manufacturing process of a semiconductor device according to one embodiment.

In the following embodiments, when required for convenience, the description will be made by dividing into a plurality of sections or embodiments, but except when specifically stated, they are not independent of each other, and one is related to the modified example, detail, supplementary description, or the like of part or all of the other. In the following embodiments, the number of elements, etc. (including the number of elements, numerical values, quantities, ranges, etc.) is not limited to the specific number, but may be not less than or equal to the specific number, except for cases where the number is specifically indicated and is clearly limited to the specific number in principle. Furthermore, in the following embodiments, it is needless to say that the constituent elements (including element steps and the like) are not necessarily essential except in the case where they are specifically specified and the case where they are considered to be obviously essential in principle. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

Details of the embodiments will be described based on the drawings. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

In the drawings used in the embodiments, hatching may be omitted even in the case of cross-sectional view in order to make the drawings easier to see. Also, even in the case of a plan view, hatching may be used to make the drawing easier to see.

Examined Example

Figure 16:
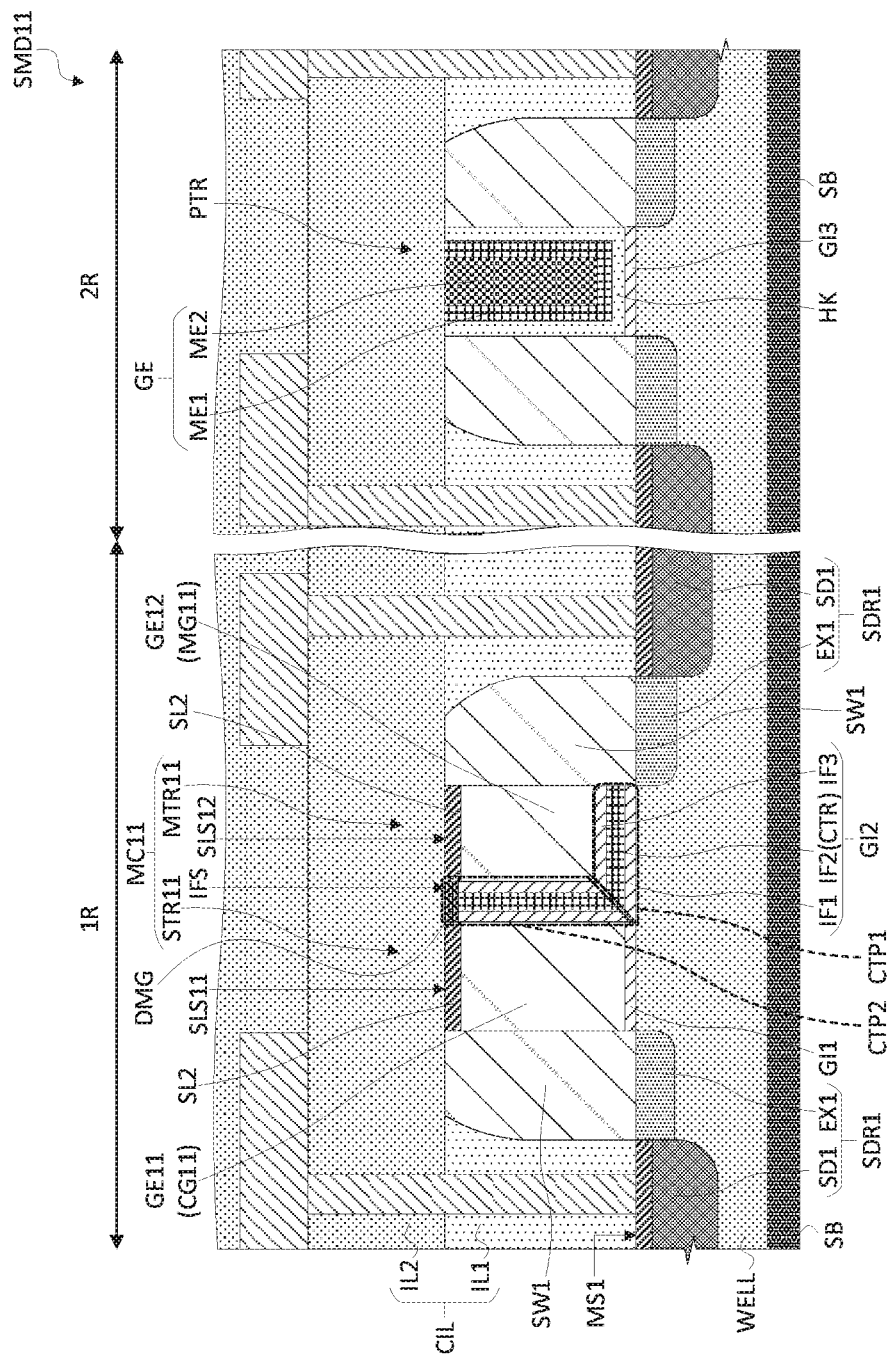
FIG. 16 is a main portion cross-section view of the semiconductor device according to examined example.
Figure 17:
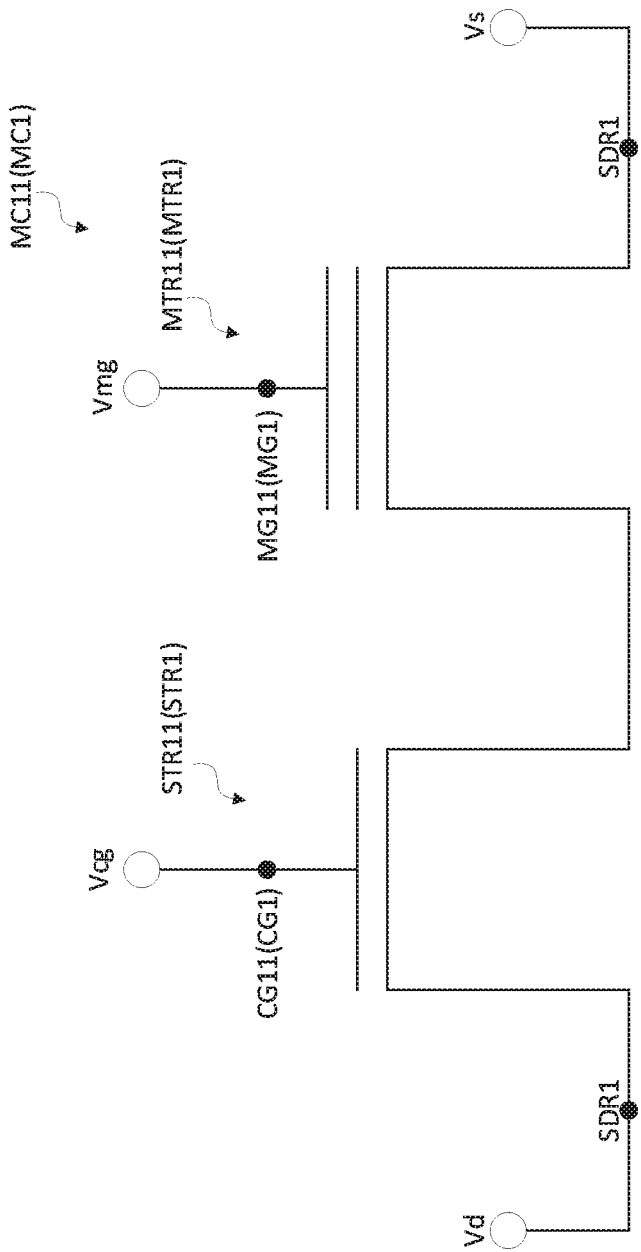
FIG. 17 is an equivalent circuit diagram of a memory cell of each of one embodiment and examined example.

First, prior to describing the semiconductor device of present embodiment and method of manufacturing the same, the examined example examined by the present inventors will be described with reference to FIGS. 16 to 18 for convenience. FIG. 16 is a main portion cross-sectional view of the semiconductor device SMD11 studied by the present inventor. FIG. 17 is an equivalent circuit diagram of a memory cell MC11 formed in the memory cell forming area 1R shown in FIG. 16. FIG. 18 is a table showing an example of voltage values to be applied to each portion of the selected memory cell in "write", "erase" and "read". FIG. 17 is an equivalent circuit diagram of a memory cell MC1 of the present embodiment described later. Each voltage value shown in FIG. 18 is also a voltage value used for each operation of the memory cell MC1 of the present embodiment described later.

<Structure of Semiconductor Device SMD11 in Examined Example>

As shown in FIGS. 16 and 17, in the memory cell forming area 1R, a memory cell MC11 of a so-called split-gate type nonvolatile memory composed of a control transistor STR11 having a control gate electrode CG11 and a memory transistor MTR11 having a memory gate electrode MG11 is formed. On the other hand, in the peripheral circuit forming area 2R, as shown in FIG. 16, field-effect transistors PTRs comprising peripheral circuits such as input/output circuits are formed. Note that the control transistor STR11 and the memory transistor MTR11 comprising the memory cell MC11 and the field-effect transistor PTR comprising the peripheral circuits are electrically isolated from each other by an element isolation portion (not shown) formed in an element isolation area. Actually, a plurality of memory cells MC11 is formed in arrays on the semiconductor substrate SB, and the plurality of memory cells MC11 are also electrically isolated from each other by the above-mentioned device isolation portions.

As shown in FIG. 16, the control gate electrodes CG11 comprising the control transistor STR11 are formed on the main surface MS1 of the semiconductor substrate SB located in the memory cell forming area 1R with the gate insulating film GI1 interposed therebetween. The memory gate electrodes MG11 comprising the memory transistors MTR11 are formed on the main surface MS1 of the semiconductor substrate SB located in the memory cell forming region 1R via a gate insulating film GI2 having a charge storage region CTR. Further, the gate electrodes GE comprising the field-effect transistors PTR are formed on the main surface MS1 of the semiconductor substrate SB located in the peripheral circuit forming area 2R via the gate insulating film GI3 and the insulating film HK formed on the gate insulating film GI3. Each of the control gate electrode CG11 comprising the control transistor STR11 and the memory gate electrode MG comprising the memory transistor MTR11 is made of polysilicon, for example. Specifically, each of the control gate electrode CG11 and the memory gate electrode MG is made of doped polysilicon into which an impurity is introduced or ion-implantation. On the other hand, the gate electrode GE comprising the field effect transistor PTR is made of a metallic such as aluminum (Al), for example. Specifically, as shown in FIG. 16, the gate electrode GE is a laminated film of a metal film ME1 formed on the insulating film HK and made of titanium aluminum (TiAl), and a metal film ME2 formed on the metal film ME1 and made of aluminum (Al). The threshold voltage of the field-effect transistor PTR can be adjusted (controlled) by the work function of the metallic film ME1 made of titanium-aluminum. The thickness of the metal film ME2 is larger than the thickness of the metal film ME1. The insulating film HK is a so-called High-k film (high dielectric constant film) made of a material having a dielectric constant (relative dielectric constant) higher than that of silicon nitride such as hafnium oxide.

As shown in FIG. 16, the gate insulating film GI2 having the charge storage region CTR has an insulating film IF1 formed on the main surface MS1 of the semiconductor substrate SB located in the memory cell forming region 1R, an insulating film IF2 formed on the insulating film IF1, and an insulating film IF3 formed on the insulating film IF2. Among the three insulating films IF1, IF2, IF3, the insulating film IF1 located closest to the semiconductor substrate SB and the insulating film IF3 located closest to the memory gate electrodes MG are made of, for example, silicon oxide (SiO). On the other hand, the insulating film IF2 sandwiched between the two insulating films IF1, IF3 is an insulating film having a trapping property, and is made of, for example, silicon nitride (SiN). That is, the two insulating films IF1, IF3 made of silicon oxide function as charge blocking layers or charge confinement layers, and the insulating film IF2 made of silicon nitride serves as the charge storage region CTR described above. In other words, the non-volatile memory discussed by the present inventors is MONOS (Metal Oxide Nitride Oxide Semiconductor) structure. Among the three insulating films IF1, IF2, IF3 comprising the gate insulating film GI2, the thickness of the insulating film IF1 located closest to the semiconductor substrate SB and the thickness of the insulating film IF3 located closest to the memory gate electrodes MG are, for example, 2 nm to 10 nm. The thickness of the insulating film IF2 serving as the charge-storage area CTR is, for example, 5 nm to 15 nm.

The control transistor STR11 is also a transistor for selecting memories, that is, a selection transistor. Therefore, the control gate electrode CG11 serves as a selection gate electrode. On the other hand, the memory transistor MTR11 is a storage transistor.

Hereinafter, the configuration of the memory cell MC11 will be described in more detail.

First, as shown in FIG. 16, the gate insulating film GI2 has a portion CTP1 located between the gate electrode GE12, which is the memory gate electrode MG, and the semiconductor substrate SB, and a portion CTP2 located between the gate electrode GE1, which is the control gate electrode CG11, and the gate electrode GE12. That is, as shown in FIG. 16, the two gate electrodes GE11, GE12 adjoin each other with the gate insulating film GI2 interposed therebetween. In other words, the two gate electrodes GE1, GE2 are electrically separated from each other by the gate insulating film GI2. A silicide layer SL2 is formed on each of the two gate electrodes GE11, GE12 exposed from the interlayer insulating film IL1 comprising the contact interlayer insulating layer CIL. As shown in FIG. 16, the upper surface SLS11 and SLS12 of each silicide layer SL2 and the upper surface (end surface) IFS of the partial CTP2 of the gate insulating film GI2 exposed from the two gate electrodes GE11, GE12 are located at substantially the same height. Note that the term "substantially the same height" herein means that they are positioned at the same height in terms of design, and that variations in manufacturing are taken into consideration.

Next, the semiconductor region SDR1 shown in FIG. 16 is a semiconductor region serving as a source/drain of the memory cell MC11. Conductive type impurities are ion-implanted into the semiconductor region SDR1. More specifically, as shown in FIG. 16, a well region WELL into which a conductive type impurity is ion-implanted is formed in the semiconductor substrate SB. The semiconductor region SDR1 is formed in the well region WELL. The polarity of the impurity comprising the well region WELL differs from the polarity of the impurity comprising the semiconductor region SDR1. The well region WELL is formed, for example, by ion-implanting p-type impurity such as boron (B) into semiconductor substrate SB. On the other hand, the semiconductor region SDR1 is formed by ion-implanting an n-type impurity such as arsenic (As) or phosphorus (P) into the semiconductor substrate SB. That is, the memory cell MC11 is an n-channel field-effect transistor. The memory cell MC11 may be a p-channel field-effect transistor. In this case, n-type impurities are ion-implanted into the well region WELL, and p-type impurities are ion-implanted into the semiconductor region SDR1.

As shown in FIG. 16, the semiconductor region SDR1 has a Lightly Doped Drain structure. Specifically, the semiconductor region SDR1 includes an extension region EX1 made of an impurity of a conductivity type having a first concentration, and a diffusion region SD1 made of an impurity of a conductivity type having a second concentration higher than the first concentration. The polarity of the impurity comprising the extension region EX1 is the same as the polarity of the impurity comprising the diffused region SD1. As shown in FIG. 16, the diffused region SD1 is in contact with the extension region EX1. As shown in FIG. 16, the extension regions EX1 and the diffused regions SD1 are formed in a self-aligned manner with respect to the gate electrodes GE11, GE12 and the sidewall spacers SW1, respectively. Further, the extension region EX1 is a region formed under an implantation condition in which the implantation energies of the above-mentioned impurities are, for example, 5 keV to 25 keV and the dose of the above-mentioned impurities is, for example, about $1\times10^{14}/cm^2$. On the other hand, the diffusion region SD1 is a region formed under an implantation condition in which the implantation energies of the above-mentioned impurities are, for example, 5 keV to 25 keV and the dose of the above-mentioned impurities is, for example, about $1\times10^{15}/cm^2$.

Further, as shown in FIG. 16, the extension region EX1 is formed at a position overlapping with the sidewall spacer SW1 in the well region WELL. Here, the sidewall spacer SW1 is formed of an insulating film made of silicon oxide, an insulating film made of silicon nitride, or a stacked-layer structure of an insulating film made of silicon oxide and an insulating film made of silicon nitride. As shown in FIG. 16, the sidewall spacers SW1 are formed on the respective side surfaces of the control gate electrode CG11 and the memory gate electrode MG11 so as to cover the respective side surfaces of the control gate electrode CG11 and the memory gate electrode MG11 as well as the main surface MS1 of the semiconductor substrate SB located in the memory cell forming area 1R. In other words, as shown in FIG. 16, the sidewall spacers SW1 are formed on the main surface MS1 of the semiconductor substrate SB located in the memory cell forming area 1R so as to sandwich the two gate insulating films GI1, GI2 and the gate electrodes GE11, GE12 forming region the memory cells MC11. On the other hand, as shown in FIG. 16, the diffused region SD1 is formed at a position exposed from the respective sidewalls SW1 in the well region WELL. That is, the extension regions EX1 and the diffused regions SD1 are not formed at positions overlapping with the gate insulating films GI1, GI2 and the gate electrodes GE11, GE12 comprising the memory cells MC11, respectively.

As shown in FIG. 16, the thickness of the diffusion region SD1 (i.e., the depth from the main surface MS1 of the semiconductor substrate SB to the bottom of the diffusion region SD1) is thicker (deeper) than the thickness of the extension region EX1 (i.e., the depth from the main surface MS1 of the semiconductor substrate SB to the bottom of the extension region EX1).

In the well region WELL, a channel region of the memory cell MC11 is a channel region between two extension regions EX1 adjacent to each other in the gate length direction of the memory cell MC11 and at a position where the channel region overlaps with each of the gate electrodes GE11, GE12. Specifically, the channel region of the control transistor STR11 is formed immediately below the gate electrode GE11, i.e., the gate insulating film GI1, in the semiconductor substrate SB. In the semiconductor substrate SB, the channel region of the memory transistor MTR11 is formed directly under the gate electrode GE12, i.e., a partial CTP1 of the gate insulating film GI2.

<Operation of Semiconductor Device SMD11 in Examined Example>

Next, the operation of the memory cell MC11 examined by the present inventor will be described. The operation of the memory cell MC11 includes a "write" operation for storing information in the memory cell MC11, a "read" operation for reading information stored in the memory cell MC11, and an "erase" operation for erasing information stored in the memory cell MC11. First, the "write" operation examined by the present inventor will be described. The present inventor has used a so-called SSI (Source Side Injection) system in which electrons are injected into the charge storage region CTR of the gate insulating film GI2, for example, when writing data into the memory cells MC11. Specifically, the present inventors applied each voltage corresponding to the "write" operation among the voltage values shown in the tables of FIG. 18 to each portion of the selected memory cell (here, memory cell MC11 shown in FIG. 16). Here, in the tables of FIG. 18, "Vcg" is a voltage to be applied to the control gate electrode CG11 shown in FIGS. 16 and 17, respectively, and "Vmg" is a voltage to be applied to the memory gate electrode MG11 shown in FIGS. 16 and 17, respectively. "Vd" is a voltage applied to one of the two semiconductor regions SDR1 shown in FIG. 16 and FIG. 17 (here, drain), and "Vs" is a voltage applied to the other of the two semiconductor regions SDR1 shown in FIG. 16 and FIG. 17 (here, source). Further, "V b" is a base voltage applied to the well region WELL shown in FIG. 16. As described above, by applying the voltages corresponding to the "write" operation to the respective portions, a channel region is formed between the two semiconductor regions SDR1 comprising the selected memory cell in the well region WELL formed in the semiconductor substrate SB (i.e., a position overlapping with each of the control gate electrode CG11 and the memory gate electrode MG11), and hot electrons (electrons accelerated by an electric field) generated in the channel region are injected into the charge storage region CTR (more specifically, the partial CTP1 of the insulating film IF2 located between the memory gate electrode MG11 and the semiconductor substrate SB) of the selected memory cell. The hot electrons injected into the charge-storage area CTR are captured by the trapping level of the insulating film IF2 made of silicon nitride, and the threshold voltage of the memory transistor MTR11 rises as a result of the trapping level of the hot electrons injected into the charge-storage area CTR. That is, the memory transistor MTR11 is in a write-in state. In the SSI-type, hot electrons are injected into the charge storage region CTR (i.e., insulating film IF2) through the insulating film IF1 located between the insulating film IF2 serving as the charge storage region CTR and the semiconductor substrate SB. Therefore, in order to perform the "write" operation at high speed, it is preferable to reduce the thickness of the gate insulating film GI2 (i.e., insulating film IF1).

Next, the "erase" operation examined by the present inventor will be described. The present inventor has used, for example, a so-called BTBT (Band To Band Tunneling) method in which holes are injected into the charge storage region CTR of the gate insulating film GI2 when erasing data written in the memory cells MC11. Specifically, the present inventors applied each voltage corresponding to the "erase" operation among the voltage values shown in the tables of FIG. 18 to each portion of the selected memory cell (here, memory cell MC11 shown in FIG. 16). As described above, by applying each voltage corresponding to the "erasing" operation to each portion, the generated holes are accelerated by an electric field, and the accelerated holes are injected into the charge accumulation region CTR. As a result, the threshold voltage of the memory transistor MTR11 decreases. That is, the memory transistor MTR11 is erased. In the SSI-type, holes are injected into the charge storage region CTR (i.e., insulating film IF2) through the insulating film IF1 located between the insulating film IF2 serving as the charge storage region CTR and the semiconductor substrate SB. Therefore, in order to perform the "erase" operation at high speed, it is preferable to reduce the thickness of the gate insulating film GI2 (i.e., insulating film IF1).

Next, the "read" operation examined by the present inventor will be described. When reading the data written in the memory cell MC11, for example, the present inventor applied each voltage corresponding to the "read" operation among the voltage values shown in the tables of FIG. 18 to each portion of the selected memory cell (here, memory cell MC11 shown in FIG. 16).

Specifically, in order to distinguish the read state from each of the write state and the erase state, the present inventor sets the value of the voltage Vmg applied to the memory gate electrode MG11 in the "read" operation to a value between the value of the voltage Vmg applied to the memory gate electrode MG11 in the "write" operation and the value of the voltage Vmg applied to the memory gate electrode MG11 in the "erase" operation.

Problems Found by Inventors

Next, the problems found by the present inventors will be described below.

The present inventors have found that when the voltages shown in the tables of FIG. 18 are applied to the respective portions of the memory cell MC11 shown in FIG. 16, a short-circuit defect is likely to occur between the gate electrode GE11 (i.e., control gate CG11) comprising the memory cell MC11 and the gate electrode GE12 (i.e., memory gate electrode MG11) also comprising the memory cell MC11. As shown in FIG. 16, the inventors of the present invention have investigated the causes of this, and found that damaged regions (damaged layers) DMGs are formed in a partial CTP2 (more specifically, between the silicide layer SL2 formed on the gate electrode GE11 and the silicide layer SL2 formed on the gate electrode GE12) of the gate insulating film GI2 located between the two gate electrodes GE11, GE12. Further, it has been clarified by the examination of the present inventor that the above-mentioned short-circuit failure is likely to occur through the damaged region. According to the study by the present inventor, this short-circuit defect tends to occur as the GI2 thickness of the gate insulating film is thinner. Further, the larger the difference between the value of the voltage Vcg applied to the control gate CG11 and the value of the voltage Vmg applied to the memory gate electrodes MG11, the easier the difference is to occur. In the semiconductor device SMD11 examined by the present inventor, a short-circuit defect is likely to occur remarkably particularly during the "write" operation (see FIG. 18).

As shown in FIG. 16, the damaged region DMG includes upper surface IFSs exposed from each of the two gate electrodes GE11, GE12 in the partial CTP2 of the gate insulating film GI2 located between the two gate electrodes GE11, GE12. That is, as shown in FIG. 16, the damaged region DMG is located not on the main surface MS1 side of the semiconductor substrate SB but on the interlayer insulating film IL2 side comprising the contact interlayer insulating layer CIL in the partial CTP2 of the gate insulating film GI2 located between the two gate electrodes GE11, GE12.

Therefore, the present inventors have examined when the above-mentioned damaged region DMG was formed. As a result, it was found that the damaged region DMG was generated by an ion implantation process for forming the semiconductor region SDR1 comprising the memory cell MC11. That is, the damaged region DMG is made of a conductivity type impurity ion-implantation from the main surface MS1 side of the semiconductor substrate SB toward the semiconductor substrate SB side in order to form the semiconductor region SDR1. The concentration of the above-mentioned impurities comprising the damaged region DMG is higher than the concentration of the above-mentioned impurities in the portion other than the damaged region DMG in the portion CTP2 of the gate insulating film GI2 located between the two gate electrodes GE11, GE12 by two orders of magnitude or more.

Here, as shown in FIG. 16, the semiconductor device SMD11 examined by the present inventor includes a field-effect transistor PTR having a gate electrode GE made of metallic. Therefore, although the detailed process will be described later, part of the gate insulating film GI2 formed in the memory cell forming area 1R is also removed by the polishing process of the interlayer insulating film IL1. That is, even if the damaged region DMG is formed on the gate insulating film GI2 by the ion implantation process for forming the semiconductor region SDR1, the damaged region DMG is also removed by the polishing process performed after the ion implantation process. However, in recent years, the thickness (height) of the respective gate electrodes tends to decrease with the miniaturization of the semiconductor device. Therefore, the amount of the gate electrode removed by the polishing process needs to be as small as possible. As a result, as shown in FIG. 16, the damaged region DMG formed in the partial CTP2 of the gate insulating film GI2 located between the two gate electrodes GE11, GE12 is easily left by the ion implantation process for forming the semiconductor region SDR1.

Embodiment

Next, the semiconductor device SMD1 of the present embodiment and method of manufacturing the same will be described.

<Semiconductor Device of Present Embodiment>

First, the difference between the semiconductor device SMD1 of present embodiment and the semiconductor device SMD11 of the examined example examined by the present inventor will be mainly described. In the semiconductor device SMD1 of the present embodiment, the explanation of the part shared by the semiconductor device SMD11 of the examined example examined by the present inventor will be omitted.

Figure 14:
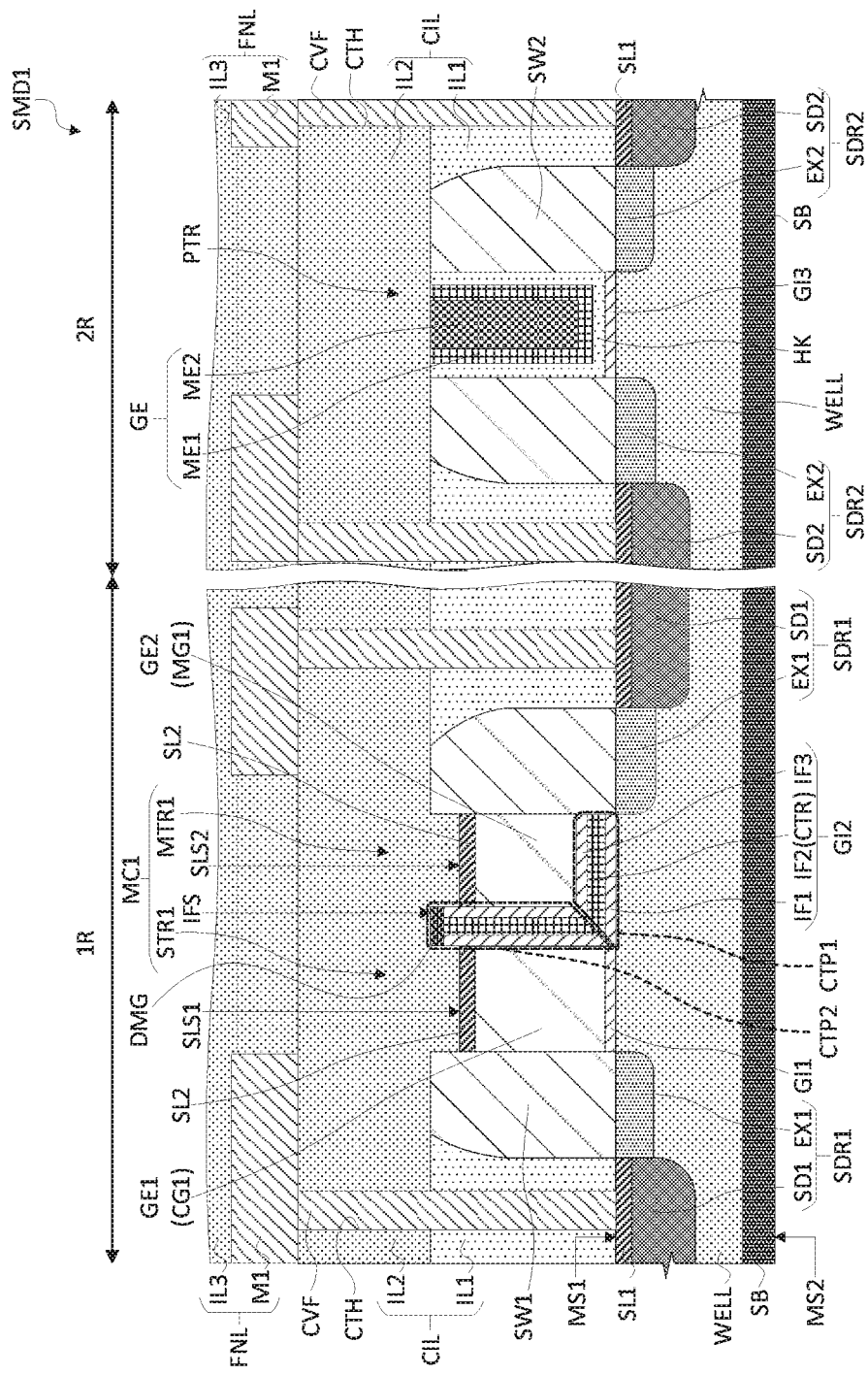
FIG. 14 is a main portion cross-section view during the manufacturing process of the semiconductor device following FIG. 13.

As shown in FIG. 14, the semiconductor device SMD1 of the present embodiment has a memory cell formation region 1R and a peripheral circuit formation region 2R separated from the memory cell formation region 1R by an element isolation portion (not shown), similarly to the semiconductor device SMD11 of the examined example examined by the present inventor. As shown in FIG. 14, while the memory cell of the split-gate type nonvolatile memory is formed in the memory cell forming region 1R, the peripheral circuit forming region 2R is formed with a field-effect transistor PTR which constitutes a peripheral circuit such as an input/output circuit and has gate electrodes GE made of metallic. However, the present embodiment memory cell MC1 differs from the examined example memory cell MC11 discussed by the inventors.

More specifically, in the examined example memory cell MC11 examined by the present inventors, as described above, the upper surface SLS11 and SLS12 of each silicide layer SL2 formed on each gate electrode GE11, GE12 and the examined example IFS of the partial CTP2 of the gate insulating film GI2 exposed from the two gate electrodes GE11, GE12 are located at substantially the same height. On the other hand, in the present embodiment memory cell MC1, the upper surface SLS1 and SLS2 of each silicide layer SL2 formed on each gate electrode GE1, GE2 and the present embodiment (end surface) IFS of the partial CTP2 of the gate insulating film GI2 exposed from the two gate electrodes GE1, GE2 are located at different heights. That is, as shown in FIG. 14, the gate electrodes GE1, GE2 are formed so that the upper surface SLS1 and SLS2 of the silicide layers SL2 are located closer to the main surface MS1 of the semiconductor substrate SB than the damaged regions DMG formed in the gate insulating film GI2. Note that the thickness of the damaged region DMG shown in FIG. 14, in other words, the implantation depth of the impurity from the upper surface IFS of the partial CTP2 of the gate insulating film GI2 exposed from the two gate electrodes GE1, GE2 is, for example, 5 nm to 15 nm. The concentration of the impurity in the damaged region DMG is two orders of magnitude higher than the concentration of the impurity in the portion of the partial CTP2 of the gate insulating film GI2 where the damaged region DMG is not formed. The level difference between the upper surface IFS of the partial CTP2 of the gate insulating film GI2 and the upper surface SLS1 and SLS2 of the silicide layers SL2 is, for example, 10 nm to 20 nm.

<Effects of Semiconductor Device SMD1 of Present Embodiment>

As described above, in present embodiment, the control gate electrode CG1, which is the gate electrode GE1 comprising the control transistor STR1, and the memory gate electrode MG1, which is the gate electrode GE2 comprising the memory transistor MTR1, are not in contact with the damaged region DMG formed in the gate insulating film GI2. In other words, the damaged region DMG is not interposed between the control gate electrode CG1 and the memory gate electrode MG1. That is, since the control gate electrode CG1 and the memory gate electrode MG1 are electrically insulated from each other by the gate insulating film GI2, even if the above-described operations ("write", "read" and "erase") are performed on the memory cell MC1, the short-circuit defect described above can be suppressed from occurring.

In present embodiment, as shown in FIG. 14, the thickness of each gate electrode GE1, GE2 is half or more of the height from the main surface MS1 of the semiconductor substrate SB to the upper surface (end surface) IFS of the partial CPT2 of the partial CPT2 of the gate insulating film GI2 located between the two gate electrodes GE1, GE2. That is, in present embodiment, when a part of each gate electrode GE1, GE2 is removed so that the upper surface SLS1 and SLS2 of each silicide layer SL2 formed in each gate electrode GE1, GE2 are located closer to the main surface MS1 of the semiconductor substrate SB than the damaged region DMG, each gate electrode GE1, GE2 is not removed more than required. As a result, it is possible to suppress the parasitic resistances of the gate electrodes GE1, GE2 comprising the field-effect transistors STR1, MTR1 from increasing. As shown in FIG. 14, even if the silicide layers SL2 are formed on the gate electrodes GE1, GE2, all of the gate electrodes GE1, GE2 can be suppressed from being silicided. In present embodiment, the thickness of the respective gate electrodes GE1, GE2 is larger than the thickness of the silicide layers SL2.

In present embodiment, as shown in FIG. 14, silicide layers SL2 are formed on the respective gate electrodes GE1, GE2. Therefore, it is possible to reduce the contact resistances between the wirings (here, wiring M1) comprising the multilayered wiring layer FNL formed on the contact interlayer insulating layer CIL covering the memory cell MC1 and the gate electrodes GE1, GE2 of the contact plugs (not shown) for electrically connecting the gate electrodes GE1, GE2 to each other. In present embodiment, as shown in FIG. 14, silicide layers SL1 are formed in diffuse regions SD1 of semiconductor regions SDR1 comprising memory cells MC1 and diffusion regions SD2 of semiconductor regions SDR2 comprising field-effect transistors PTRs. Therefore, it is possible to reduce the contact resistances between the wirings comprising the multilayered wiring layer FNL described above (here, wiring M1) and the diffusion regions SD1, SD2 of the contact plugs CVF electrically connecting the diffusion regions SD1, SD2 described above. As a result, the memory cell MC1 and the field-effect transistor PTR, i.e., the semiconductor device SMD1, can be speeded up.

Further, as shown in FIG. 14, present embodiment employs a so-called LDD-structure in which an extension region EX1, EX2 made of an impurity having a density lower than that of the diffusion region SD1, SD2 is formed between a channel region formed directly under the gate electrodes GE1, GE2 and GE of the field-effect transistors STR1, MTR1 and PTR and each diffusion region SD1, SD2 to which the contact plugs CVF are connected. Therefore, it is possible to suppress the generation of a leakage current which becomes remarkable with the miniaturization of the semiconductor device.

Further, in present embodiment, since the gate electrode GE of the field-effect transistor PTR formed in the peripheral-circuit forming area 2R is made of a metallic, it is possible to suppress depletion of the gate electrode as compared with the case where the gate electrode GE is formed using polysilicon. That is, since the parasitic capacitance of the gate electrode can be reduced, it is suitable for miniaturization of the field effect transistor PTR.

<Method of Manufacturing Semiconductor Device SMD1 of Present Embodiment>

Next, the method of manufacturing of the semiconductor device SMD1 of the present embodiment will be described with reference to FIGS. 1 to 14. FIG. 1 is a process flow diagram showing the manufacturing process of semiconductor device SMD1 of present embodiment. FIGS. 2 to 14 are a main portion cross-sectional view of the present embodiment during the manufacturing process of the semiconductor device.

1. Providing Substrate (Step S1 in FIG. 1)

Figure 2:
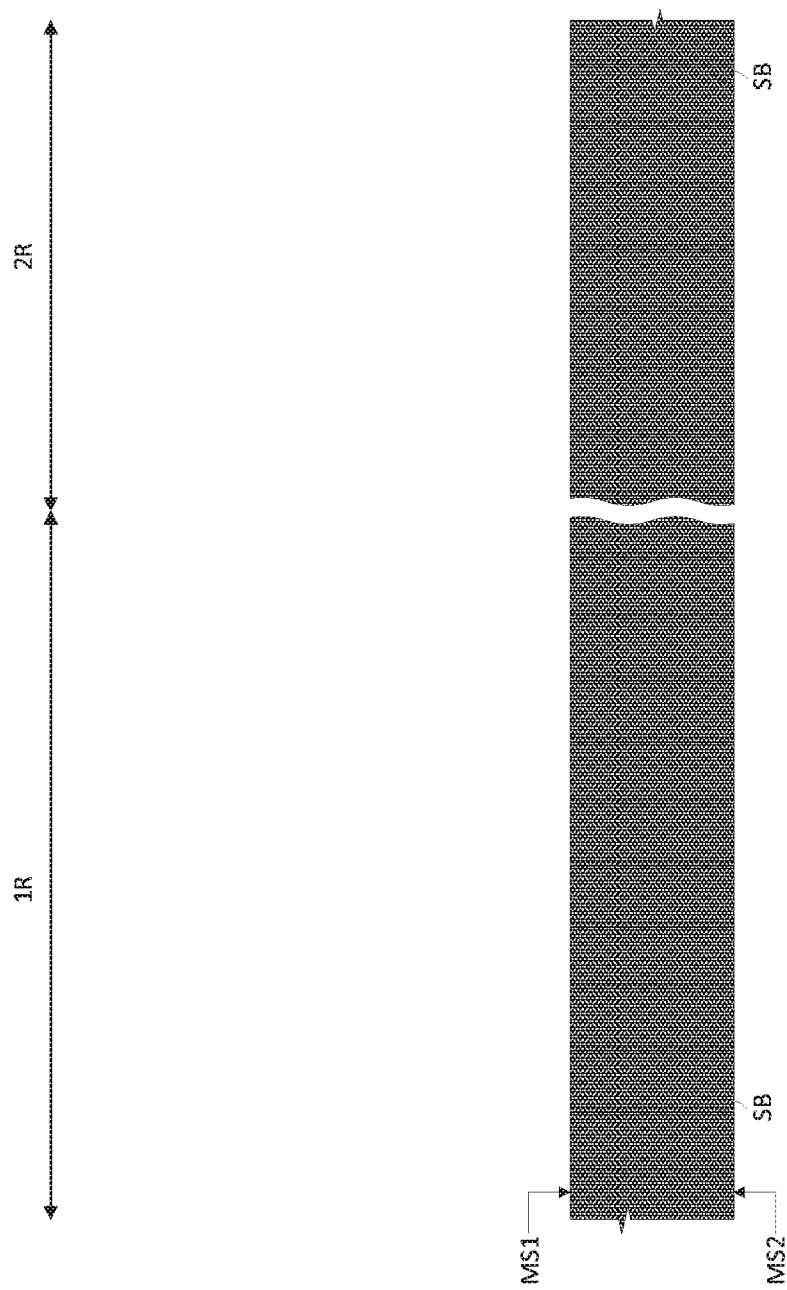
FIG. 2 is a main portion cross-section view during a manufacturing process of the semiconductor device according to one embodiment.

First, as step S1 shown in FIG. 1, the semiconductor substrate SB is prepared. As shown in FIG. 2, the prepared semiconductor substrate SB has a memory cell formation region 1R and a peripheral circuit formation region 2R. The two regions 1R, 2R are separated from each other by an element isolation portion formed in an element isolation region (not shown). As shown in FIG. 2, the semiconductor substrate SB has a main surface MS1 on which semiconductor elements such as memory cells MC1 and field-effect transistors PTR are formed later, and a main surface MS2 on the other side of the semiconductor elements such as the memory cells MC1 and the field-effect transistors PTR, which is opposed to the main surface MS1. The semiconductor substrate SB used in the present embodiment is made of p-type monocrystalline silicon having a resistivity of, for example, 1 Ωcm to 10 Ωcm.

2. Forming Gate Electrode (Step S2 IN FIG. 1)

Figure 3:
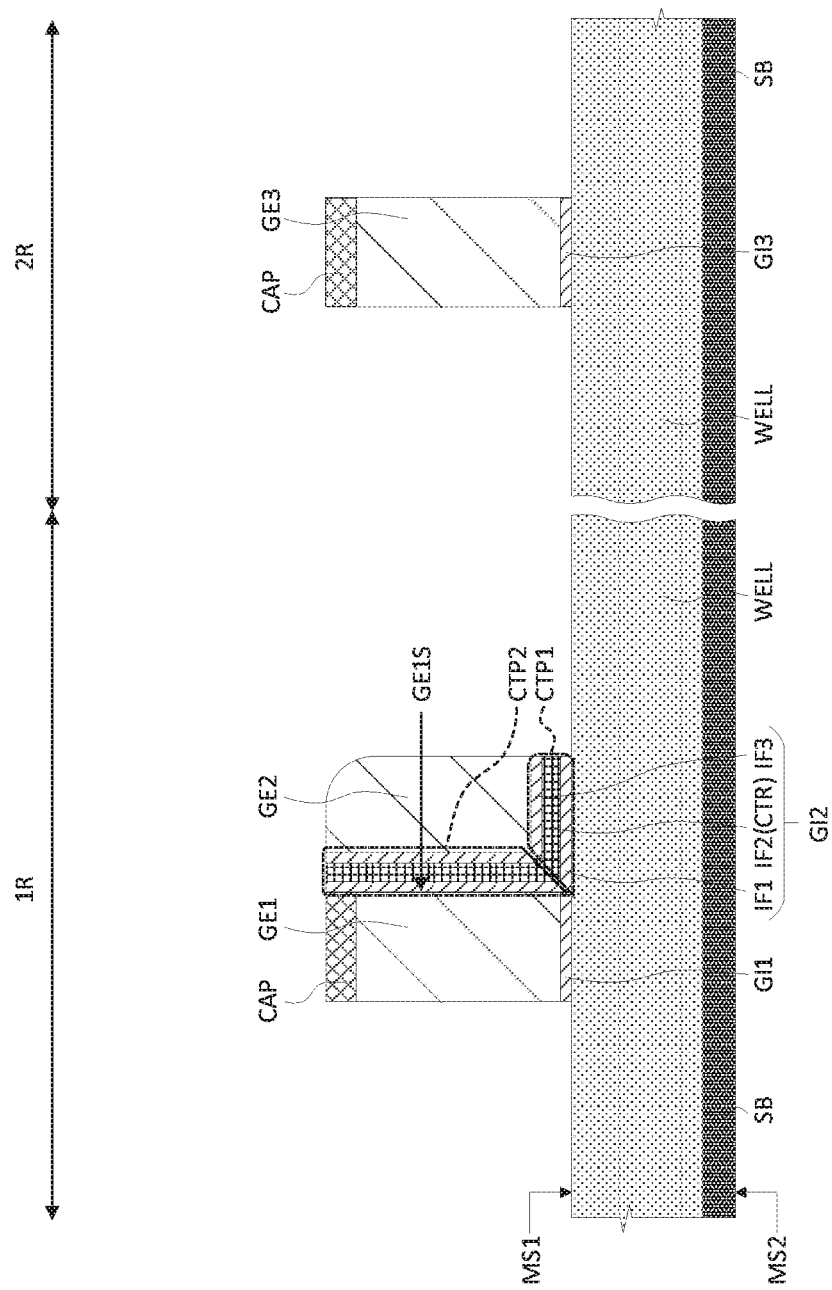
FIG. 3 is a main portion cross-section view during the manufacturing process of the semiconductor device following FIG. 2.

Next, in step S2 shown in FIG. 1, gate electrodes GE1, GE2, GE3 are formed in the respective regions 1R, 2R. Specifically, first, a p-type impurity such as boron (B) is ion-implanted into the semiconductor substrate SB to form a well region WELL in the semiconductor substrate SB. Thereafter, the gate electrode GE1 is formed on the main surface MS1 of the semiconductor substrate SB located in the memory cell forming region 1R via the gate insulating film GI1. A gate electrode GE2 is formed on each of the main surface MS1 of the semiconductor substrate SB located in the memory cell forming area 1R and the side surface GE1S of the gate electrode GE1 via a gate insulating film GI2. Further, the gate electrode GE3 is formed on the main surface MS1 of the semiconductor substrate SB located in the peripheral circuit-forming region 2R via the gate insulating film GI3. In present embodiment, the gate insulating film GI1 formed between the gate electrode GE1 and the semiconductor substrate SB and the gate insulating film GI3 formed between the gate electrode GE3 and the semiconductor substrate SB are made of, for example, silicon oxide. As shown in FIG. 3, the gate insulating film GI2 having the portion CTP1 located between the gate electrode GE2 and the semiconductor substrate SB and the portion CTP2 located between the gate electrode GE2 and the gate electrode GE1 has, for example, two insulating films IF1, IF2 made of silicon oxide, and an insulating film GE2 made of silicon nitride (i.e., charge-storage area CTR) sandwiched between the two insulating films IF1, IF3. Each of the gate electrodes GE1, GE2, GE3 formed in each of the regions 1R, 2R is made of, for example, polysilicon, specifically doped polysilicon into which an impurity is introduced or ion-implanted. Further, as shown in FIG. 3, a cap insulating film CAP made of, for example, silicon nitride is formed on each of the gate electrodes GE1 and the gate insulating film GE3. The capping insulating film CAP serves as a protective film for preventing the silicide layers SL1 described later from being formed on the respective gate electrodes GE1, GE3.

3. Forming Extension Region (Step S3 in FIG. 1)

Figure 4:
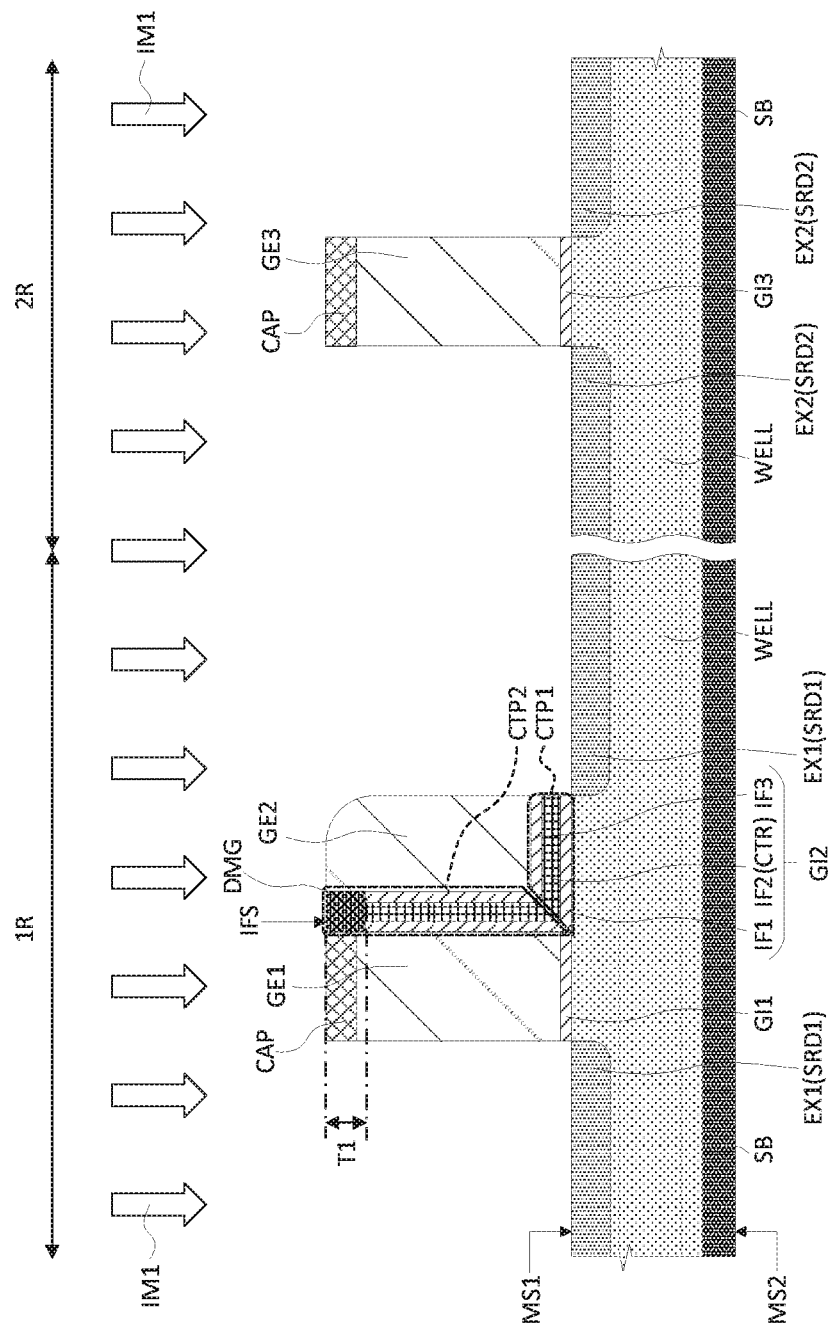
FIG. 4 is a main portion cross-section view during the manufacturing process of the semiconductor device following FIG. 3.

Next, as step S3 shown in FIG. 1, extension regions EX1, EX2 are formed in the regions 1R, 2R. Specifically, as shown in FIG. 4, an n-type impurity IM1 such as arsenic (As) or phosphorus (P) is ion-implanted into the semiconductor substrate SB from the main surface MS1 of the semiconductor substrate SB. The implantation condition of the impurity IM1 is, for example, 5 keV to 25 keV, and the dose thereof is, for example, about $1 \times 10^{14}/cm^2$. As a result, as shown in FIG. 4, in the semiconductor substrate SB (more specifically, the well region WELL) located in the memory cell forming region 1R, an extension region (semiconductor region, impurity diffused layer) EX1 made of a n-type impurity is formed in a portion exposed from each of the two gate electrodes GE1, GE2 and the gate insulating film GI2. Similarly, as shown in FIG. 4, an extension region (semiconductor region, impurity diffused layer) EX2 made of n-type impurity is formed in a portion of the semiconductor substrate SB (more specifically, well region WELL) located in the peripheral-circuit forming region 2R exposed from the gate electrode GE3. Each of the gate electrodes GE1, GE2, GE3 and the gate insulating film GI2 serves as masks, and each of the extension regions EX1, EX2 is formed in a self-aligned manner with respect to each of the gate electrodes GE1, GE2, GE3, as shown in FIG. 4. Each extension region EX1, EX2 is a part of a semiconductor region SDR1, SDR2 serving as a source or a drain of each field-effect transistor STR1, MTR1 or PTR formed later in each region 1R, 2R.

Here, when the extension regions EX1, EX2 are formed in the respective regions 1R, 2R, the impurity ions are also implanted into the partial CTP2 of the gate insulating film GI2 exposed from the two gate electrodes GE1, GE2. Therefore, by performing this step S3, as shown in FIG. 4, the damaged region (damaged layer) DMGs made of the above-described impurity is formed in the partial CTP2 of the gate insulating film GI2 located between two gate electrodes GE1, GE2 adjacent to each other with the gate insulating film GI2 interposed therebetween. The damaged region DMG has an upper surface IFS exposed from each of the two gate electrodes GE1, GE2 in the partial CTP2 described above.

The thickness (depth from the upper surface IFS) T1 of the damaged region DMG formed by performing step S3 is, for example, 10 nm to 15 nm.

4. Forming Sidewall Spacer

Figure 5:
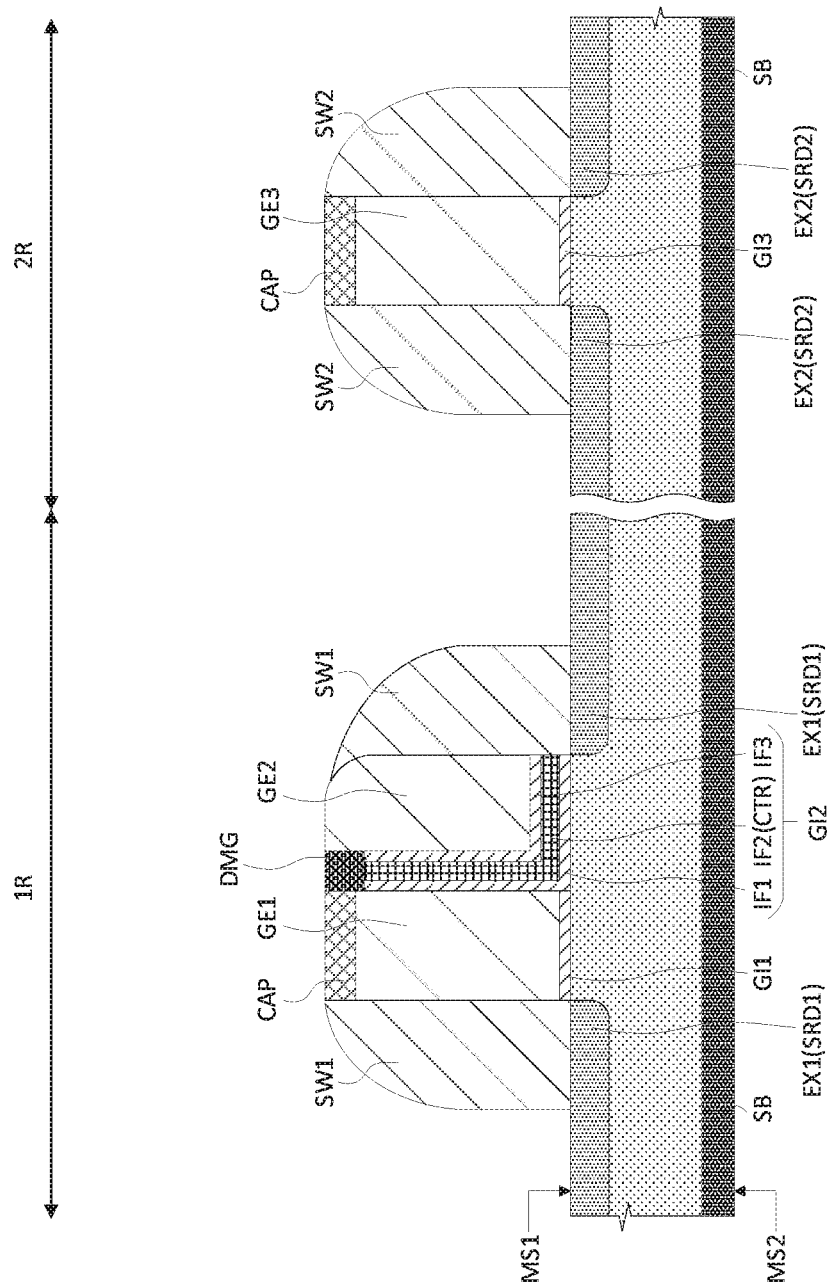
FIG. 5 is a main portion cross-section view during the manufacturing process of the semiconductor device following FIG. 4.

Next, sidewall spacers SW1, SW2 are formed in the respective regions 1R, 2R. Specifically, as shown in FIG. 5, a sidewall spacer SW1 is formed on the main surface MS1 of the semiconductor substrate SB located in the memory cell forming area 1R so as to sandwich the two gate electrodes GE1, GE2 and the gate insulating film GI2. Similarly, as shown in FIG. 5, a sidewall spacer SW2 is formed on the main surface MS1 of the semiconductor substrate SB located in the peripheral circuit-forming area 2R so as to sandwich the gate electrode GE3 therebetween. As a result, as shown in FIG. 5, the side surface of the gate electrode GE1 exposed from the cap insulating film CAP and the gate insulating film GI2 and the side surface of the gate electrode GE2 exposed from the gate insulating film GI2 are covered with the sidewall spacer SW1 formed on the semiconductor substrate SB located in the memory cell forming region 1R so as to cover a part of the extension region EX1. As shown in FIG. 5, the side surfaces of the gate electrodes GE3 exposed from the cap insulating film CAP are covered with a sidewall spacer SW2 formed on the semiconductor substrate SB located in the peripheral circuit forming region 2R so as to cover a part of the extension region EX2. The sidewall spacers SW1, SW2 are formed of insulating films made of silicon oxide, insulating films made of silicon nitride, or stacked structures of insulating films made of silicon oxide and insulating films made of silicon nitride.

5. Forming Diffusion Region

Figure 6:
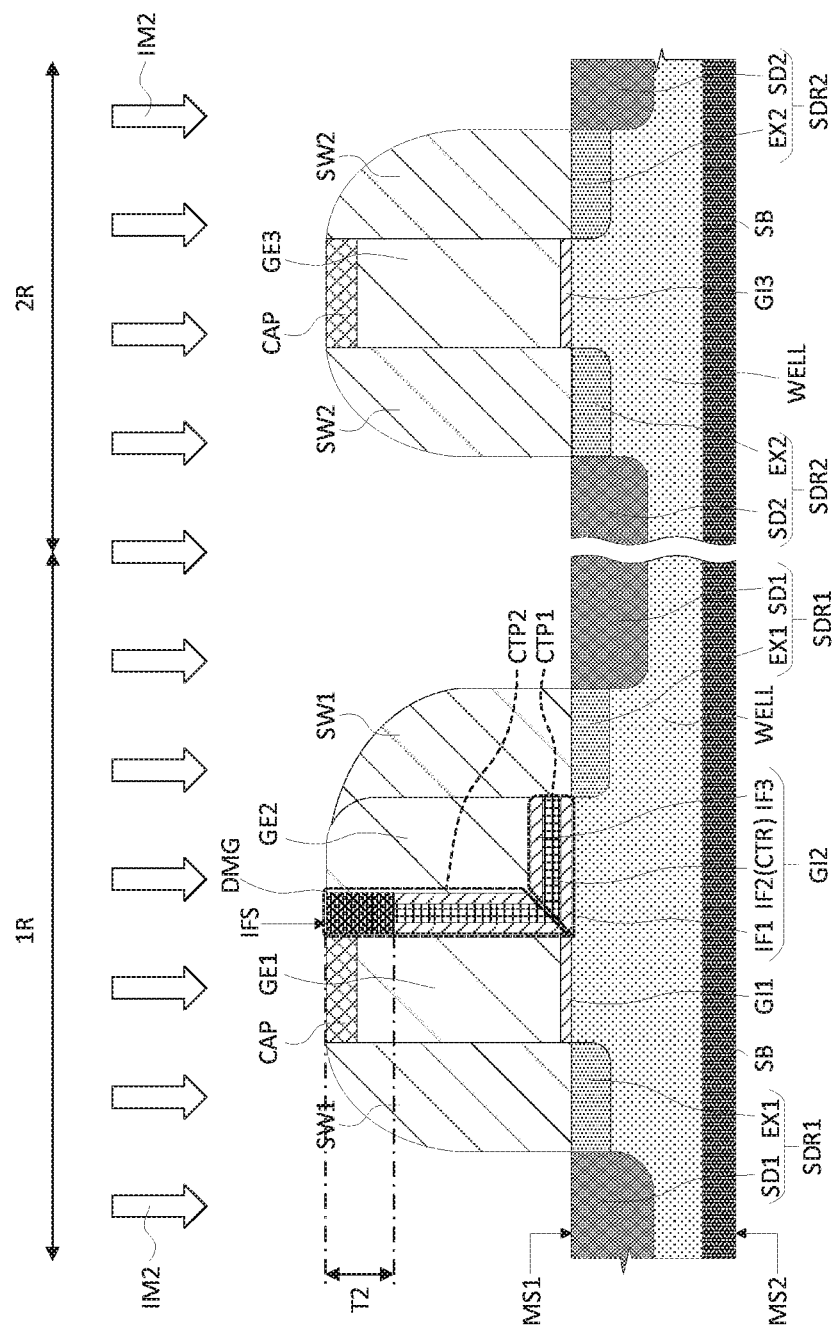
FIG. 6 is a main portion cross-section view during the manufacturing process of the semiconductor device following FIG. 5.

Next, diffused regions SD1, SD2 are formed in the respective regions 1R, 2R. Specifically, as shown in FIG. 6, an n-type impurity IM2 such as arsenic (As) or phosphorus (P) is ion-implanted into the semiconductor substrate SB from the main surface MS1 of the semiconductor substrate SB. The implantation condition of the impurity IM2 is, for example, 5 keV to 25 keV, and the dose thereof is, for example, about $1\times10^{15}/cm^2$. As a result, as shown in FIG. 6, a diffusion region (semiconductor region, impurity diffusion layer) SD1 made of n+ type impurities is formed in a portion exposed from each of the sidewall spacer SW1, the two gate electrodes GE1, GE2, and the gate insulating film GI2 in the semiconductor substrate SB (more specifically, the well region WELL) located in the memory cell forming region 1R. Similarly, as shown in FIG. 6, a diffusion region (semiconductor region, impurity diffusion layer) SD2 made of n+ type impurity is formed in portions of the semiconductor substrate SB (more specifically, well regions WELL) located in the peripheral-circuit forming regions 2R exposed from the sidewall spacers SW2 and the gate electrodes GE3. Each of the sidewall spacers SW1, SW2, each of the gate electrodes GE1, GE2, GE3, and the gate insulating film GI2 serves as mask, and each of the diffused regions SD1, SD2 is formed in a self-aligned manner with respect to each of the sidewall spacers SW1, SW2, as shown in FIG. 6. Further, each of the diffused regions SD1, SD2 is a part of the semiconductor region SDR1, SDR2 serving as a source or a drain of each of the field-effect transistors STR1, MTR1 and PTRs formed later in each of the regions 1R, 2R. That is, the semiconductor region SDR1, SDR2 serving as the source/drain of each of the field-effect transistors STR1, MTR1 and PTR includes each of the extension regions EX1, EX2 and each of the diffused regions SD1, SD2.

Here, the concentration of the impurity to be ion-implantation in this step is higher than the concentration of the impurity ion-implanted in step S3 described above. That is, the concentration of the impurity comprising each diffusion region SD1, SD2 is higher than the concentration of the impurity comprising each extension region EX1, EX2. In other words, the concentration of the impurity comprising each extension region EX1, EX2 is lower than the concentration of the impurity comprising each diffused region SD1, SD2. Then, as shown in FIG. 6, the impurity comprising each diffusion region SD1, SD2 is diffused to a position deeper than the impurity comprising each extension region EX1, EX2. In other words, each diffusion region SD1, SD2 has a portion (region) located closer to the main surface MS2 of the semiconductor substrate SB than each extension region EX1, EX2.

When the diffused regions SD1, SD2 are formed in the respective regions 1R, 2R, the impurity ions are also implanted into the partial CTP2 of the gate insulating film GI2 exposed from the two gate electrodes GE1, GE2. Therefore, the damaged region DMG formed by performing the above-described step S3 is further diffused toward the main surface MS1 of the semiconductor substrate SB by performing this step, as shown in FIG. 6. By performing this step, the thickness (depth from the upper surface IFS) T2 of the damaged region DMG is increased to, for example, 20 nm to 25 nm. In addition, the concentration of the impurity in the damaged region DMG after this step is higher than the concentration of the impurity in the portion of the partial CTP2 of the gate insulating film GI2 where the damaged region DMG is not formed by two orders of magnitude or more.

6. Forming Interlayer Insulating Film (Step S4 in FIG. 1)

Figure 7:
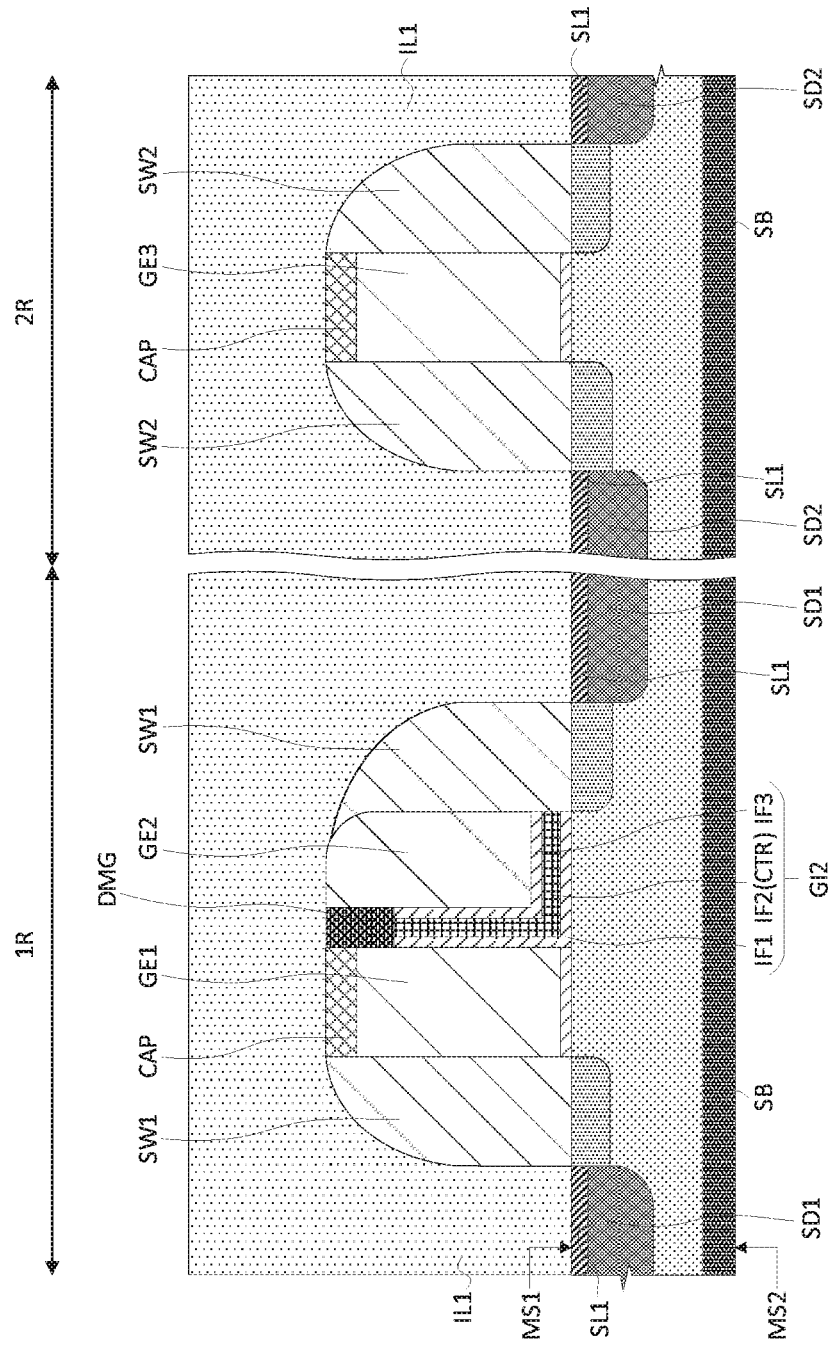
FIG. 7 is a main portion cross-section view during the manufacturing process of the semiconductor device following FIG. 6.

Next, as step S4 shown in FIG. 1, an interlayer insulating film IL1 is formed on the semiconductor substrate SB. Specifically, after forming a silicide layer SL1 in each of the diffused regions SD1, SD2 formed in the preceding steps by, for example, a salicide technique, an interlayer insulating film SD1, SD2 is formed on the main surface MS1 of the semiconductor substrate SB including the memory cell forming region 1R and the peripheral circuit forming region 2R so as to cover the gate insulating film GI2 in which each of the sidewall spacers SW1, SW2, each of the gate electrodes GE1, GE2, GE3 and the damaged region DMG is formed, as shown in FIG. 7. The interlayer insulating film IL1 is made of, for example, silicon oxide, and is formed by the CVD method. The silicide layer SL1 is, for example, a cobalt silicide layer, a nickel silicide layer, or a platinum-added nickel silicide layer.

7. Polishing (Step S5 in FIG. 1)

Figure 8:
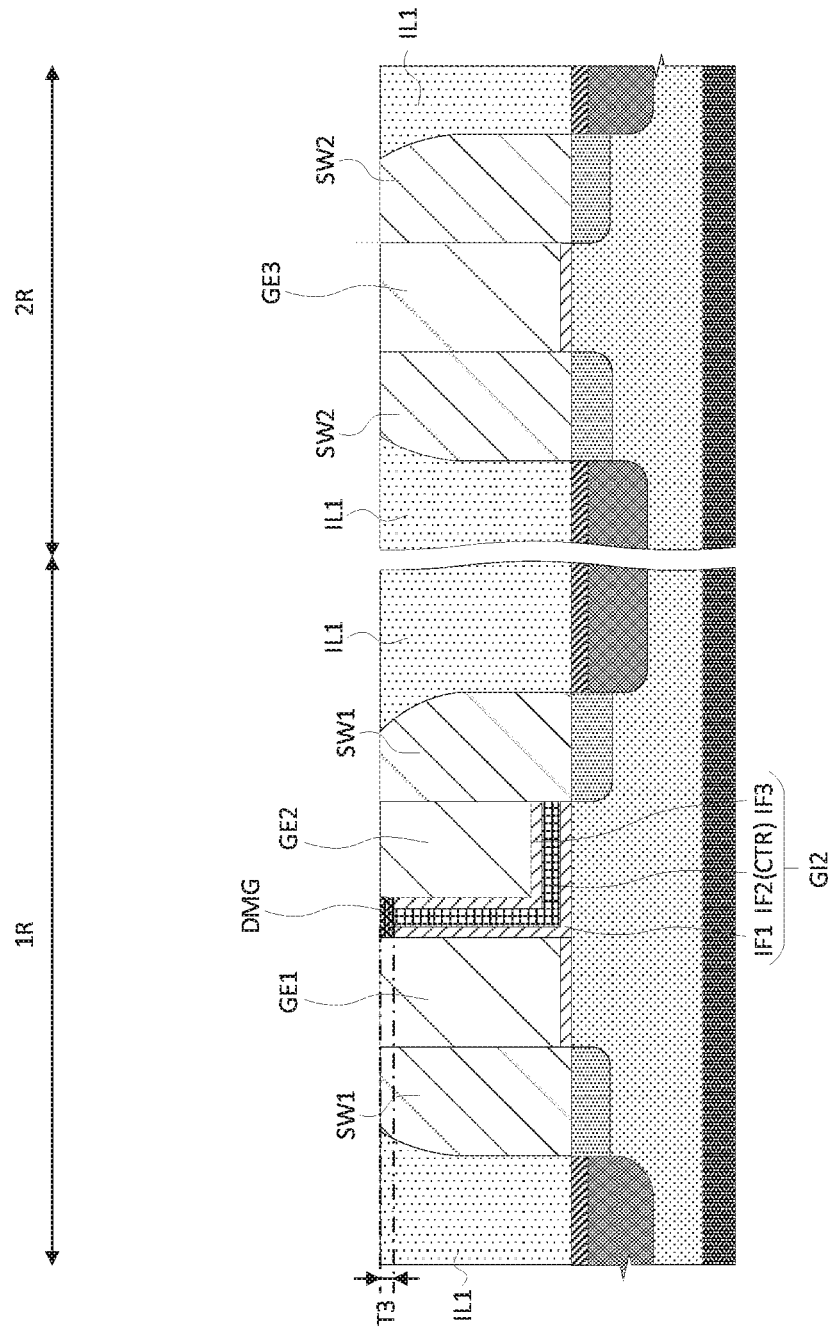
FIG. 8 is a main portion cross-section view during the manufacturing process of the semiconductor device following FIG. 7.

Next, in step S5 shown in FIG. 1, a part of the interlayer insulating film IL1 formed in step S4 described above is removed. Specifically, the interlayer insulating film IL1, the sidewall spacers SW1, SW2, and the capping insulating film CAP are polished so that a part of each of the gate electrodes GE1, GE2, GE3 is exposed. At this time, a part of the gate electrodes GE1, GE2, GE3 and a part of the gate insulating film GI2 are also polished. As a result, as shown in FIG. 8, the gate electrodes GE1, GE2, GE3 covered with the interlayer insulating film IL1 or the cap insulating film CAP are reliably exposed. As shown in FIG. 8, the upper surface (polished surface and exposed surface) of the interlayer insulating film IL1, the sidewall spacers SW1, SW2, the gate electrodes GE1, GE2, GE3, and the gate insulating film GI2 are located at substantially the same height.

Here, the polishing condition (polishing quantity, polishing duration, etc.) in this step S5 is mainly a condition under which the gate electrode (in the case of present embodiment, the gate electrode GE3) to be replaced with another material can be exposed. That is, the polishing condition in this step S5 is such that the gate electrode is not removed more than necessary. Therefore, even after the step S5 is performed, as shown in FIG. 8, the damaged region DMG still remains between the two gate electrodes GE1, GE2 adjacent to each other with the gate insulating film GI2 interposed therebetween. The thickness T3 of the damaged DMG remaining after the step S5 is, for example, 5 nm to 15 nm. In addition, the thickness of the gate electrodes GE1, GE2 remaining after the step S5 is, for example, 50 nm to 100 nm. However, the gate electrode GE2, which later becomes the memory gate electrode MG1 of the memory transistor MTR1, is formed on the semiconductor substrate SB located in the memory cell forming area 1R via the gate insulating film GI2 having a thickness (total thickness) larger than that of the gate insulating film GI1. Therefore, the thickness of the gate electrode GE2 remaining after the main step S5 is thinner than the thickness of the gate electrode GE1 remaining after the main step S5.

8. Displacing (Step S6 in FIG. 1)

Figure 9:
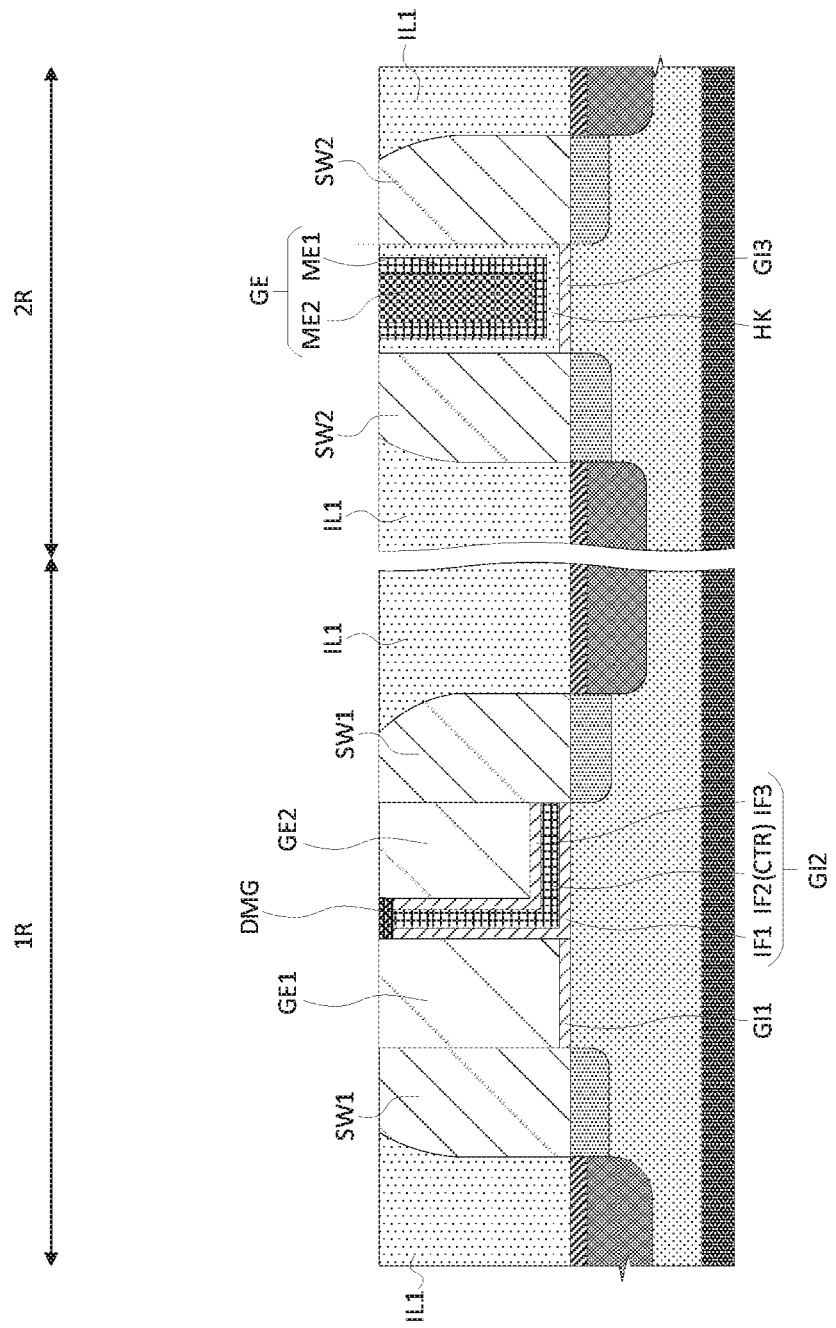
FIG. 9 is a main portion cross-section view during the manufacturing process of the semiconductor device following FIG. 8.

Next, as step S6 shown in FIG. 1, the material comprising the gate electrode G3 is replaced with a material different from this material. Specifically, first, the memory cell forming regions 1R are covered with masks (not shown). Then, the gate electrode GE3 located in the peripheral circuit forming region 2R and made of polysilicon is removed while the memory cell forming region 1R is covered with a mask (not shown). Thereafter, on the gate insulating film GI3 exposed by removing the gate electrode GE3, a metal film ME1 and a gate electrode GE made of a metal film ME2 formed on the metal film ME1 are formed with an insulating film HK, which is a High-k film, interposed therebetween. The metallic film ME1 is made of, for example, TiAl. The metallic film ME2 is made of aluminum (Al), for example. Further, as shown in FIG. 9, the insulating film HK is formed not only between the gate electrode GE and the gate insulating film GI3 but also between the gate electrode GE and the sidewall spacer SW2.

9. Etching Back of Gate Electrode (Step S7 in FIG. 1)

Figure 10:
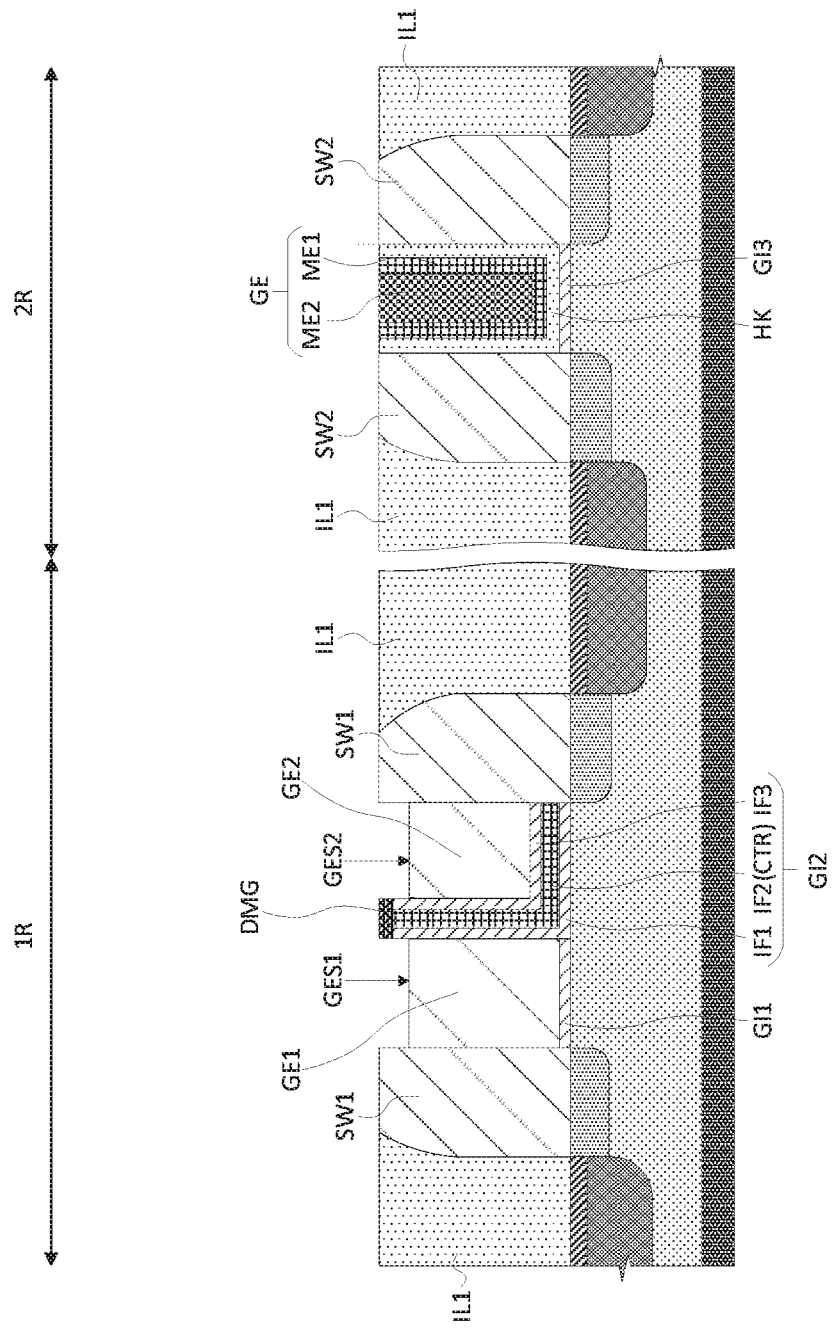
FIG. 10 is a main portion cross-section view during the manufacturing process of the semiconductor device following FIG. 9.

Next, in step S7 shown in FIG. 1, portions of the gate electrodes GE1, GE2 exposed from the interlayer insulating film IL1 and the sidewall spacers SW1 are removed. Specifically, first, the peripheral-circuit forming regions 2R are covered with masks (not shown). Then, as shown in FIG. 10, a part of each gate electrode GE1, GE2 is removed by wet etching using a chemical so that the upper surface GES1 and GES2 of each gate electrode GE1, GE2 exposed from the interlayer insulating film IL1 and the sidewall spacer SW1 are located closer to the main surface MS1 of the semiconductor substrate SB than the damaged region DMG while covering the peripheral circuit forming region 2R with a mask (not shown). The thickness of each gate electrode GE1, GE2 to be removed in step S7, that is, the amount of etching or removal of each gate electrode GE1, GE2, is larger than the thickness T3 of the damaged region DMG after step S5 and smaller than the thickness of each gate electrode GE1, GE2 after step S5. More specifically, the thickness of each gate electrode GE1, GE2 removed in this step S7 is such that the thickness of each gate electrode GE1, GE2 remaining after the silicide layer SL2 is formed is larger than the thickness of the silicide layer SL2 formed in the step described later. That is, the thickness of the respective gate electrodes GE1, GE2 to be removed in step S7 is, for example, 10 nm to 20 nm.

10. Silicidation

Figure 11:
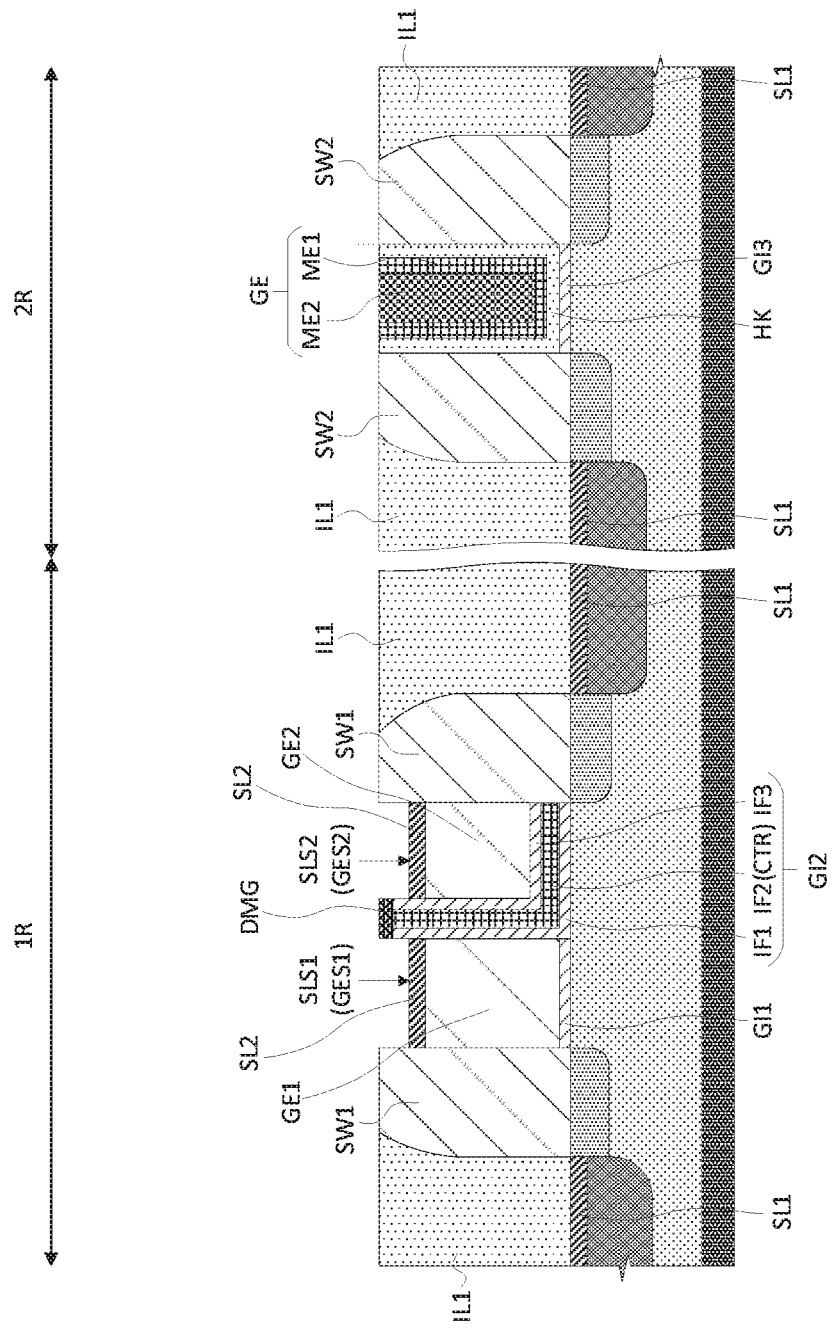
FIG. 11 is a main portion cross-section view during the manufacturing process of the semiconductor device following FIG. 10.

Next, silicide layers SL2 are formed on the respective gate electrodes GE1, GE2. Specifically, like the silicide layer SL1, a metallic film (not shown) is disposed on the upper surface GES1 and GES2 of each gate electrode GE1, GE2 exposed from the interlayer insulating film IL1, each sidewall spacer SW1, and the gate insulating film GI2, and a silicide layer SL2 is formed on each gate electrode GE1, GE2 by, for example, a salicide technique. Like the silicide layer SL1, the silicide layer SL2 is, for example, a cobalt silicide layer, a nickel silicide layer, or a platinum-added nickel silicide layer. The silicide layer SL2 is a layer formed by reacting a part of the gate electrode GE1, GE2 with the above-described metallic film (not shown). Therefore, as shown in FIG. 11, a part of the gate electrode GE1, GE2 becomes a silicide layer SL2. That is, the upper surface SLS1 of the silicide layer SL2 formed on the gate electrode GE1 and the upper surface SLS2 of the silicide layer SL2 formed on the gate electrode GE2 are located at substantially the same height as the upper surface GES1 of the gate electrode GE1 after the etching back of the gate electrode and the GE1 GES2 of the gate electrode GE2 after the etching back of the gate electrode, respectively. The level difference between the upper surface IFS of the partial CTP2 of the gate insulating film GI2 and the upper surface SLS1 and SLS2 of the silicide layers SL2 is, for example, 10 nm to 20 nm.

As shown in FIG. 11, the silicide layers SL2 are formed on the respective gate electrodes GE1, GE2 so as not to be contacted with the damaged regions DMGs formed on the gate insulating film GI2. In other words, the damaged region DMG is not interposed between the silicide layer SL2 formed on the gate electrode GE1 and the silicide layer SL2 formed on the gate electrode GE2.

The thickness of the silicide layers SL2 formed by performing the present steps is, for example, 10 nm to 20 nm. As described above, in present embodiment, the thickness of the gate electrode GE1, GE2 to be removed in the gate electrode etch-back step (step S7) (i.e., the amount of etching or removal of the gate electrode GE1, GE2) is set to, for example, about 10 nm to 20 nm. Therefore, even if this step is performed, all of the gate electrodes GE1, GE2 are not silicided as shown in FIG. 11.

11. Formation of Contact Interlayer Insulating Layer

Figure 12:
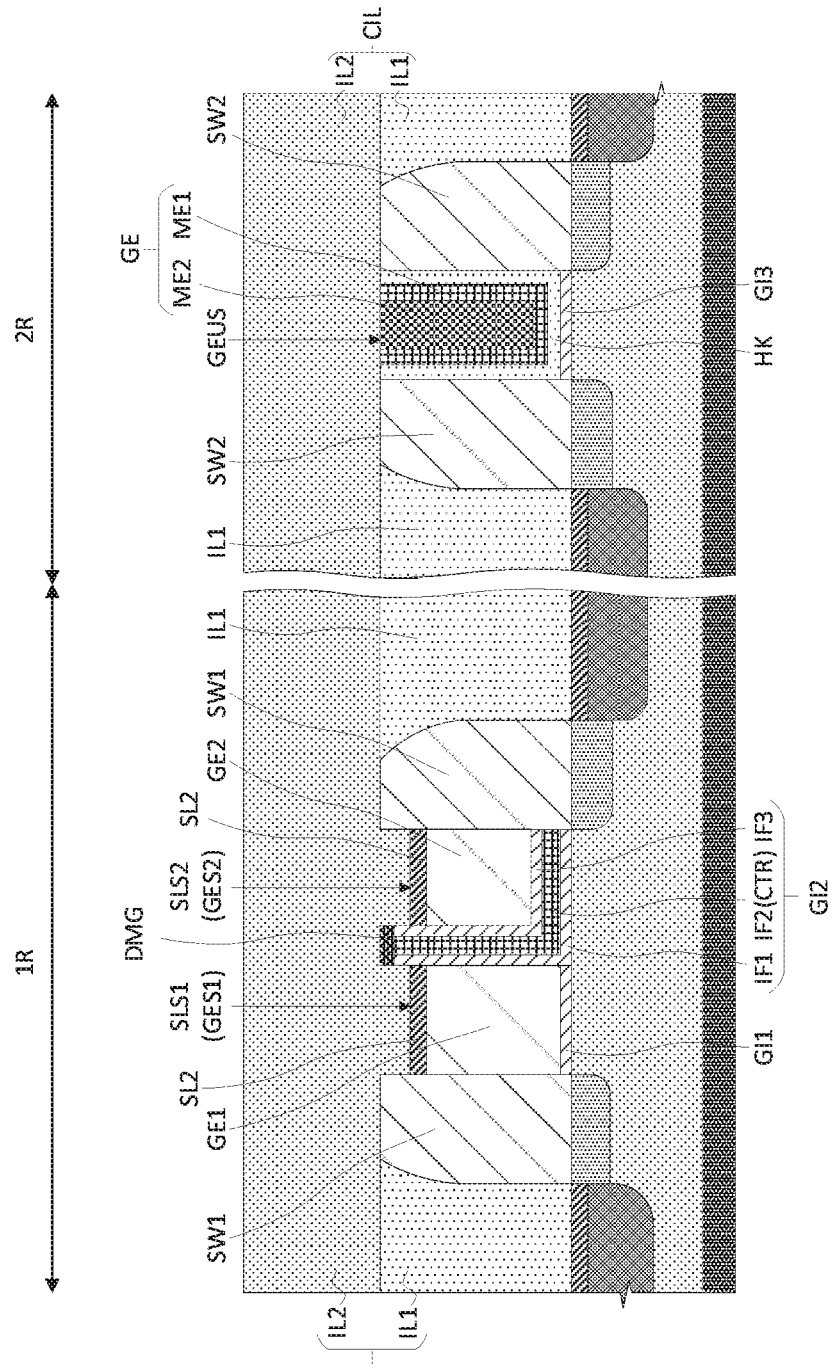
FIG. 12 is a main portion cross-section view during the manufacturing process of the semiconductor device following FIG. 11.

Next, an interlayer insulating film IL2 is formed on the semiconductor substrate SB so as to cover the interlayer insulating film IL1, the sidewall spacers SW1, SW2, the gate electrodes GE1, GE2, GE3, and the gate insulating film GI2. As a result, as shown in FIG. 12, the upper surface GES1 of the gate electrode GE1 (i.e., upper surface SLS1 of silicide layer SL2), the upper surface GES2 of the gate electrode GE2 (i.e., upper surface SLS2 of silicide layer SL2) and the upper surface GEUS of the gate electrode GE, which are exposed from the interlayer insulating film IL1, each sidewall spacer SW1, SW2, the gate insulating film GI2 and the insulating film HK, are protected by the interlayer insulating film IL2. The interlayer insulating film IL1 remaining in step S5 and the interlayer insulating film IL2 formed in step S5 function as materials comprising the contact interlayer insulating layer CIL, respectively.

12. Forming Contact Plug

Figure 13:
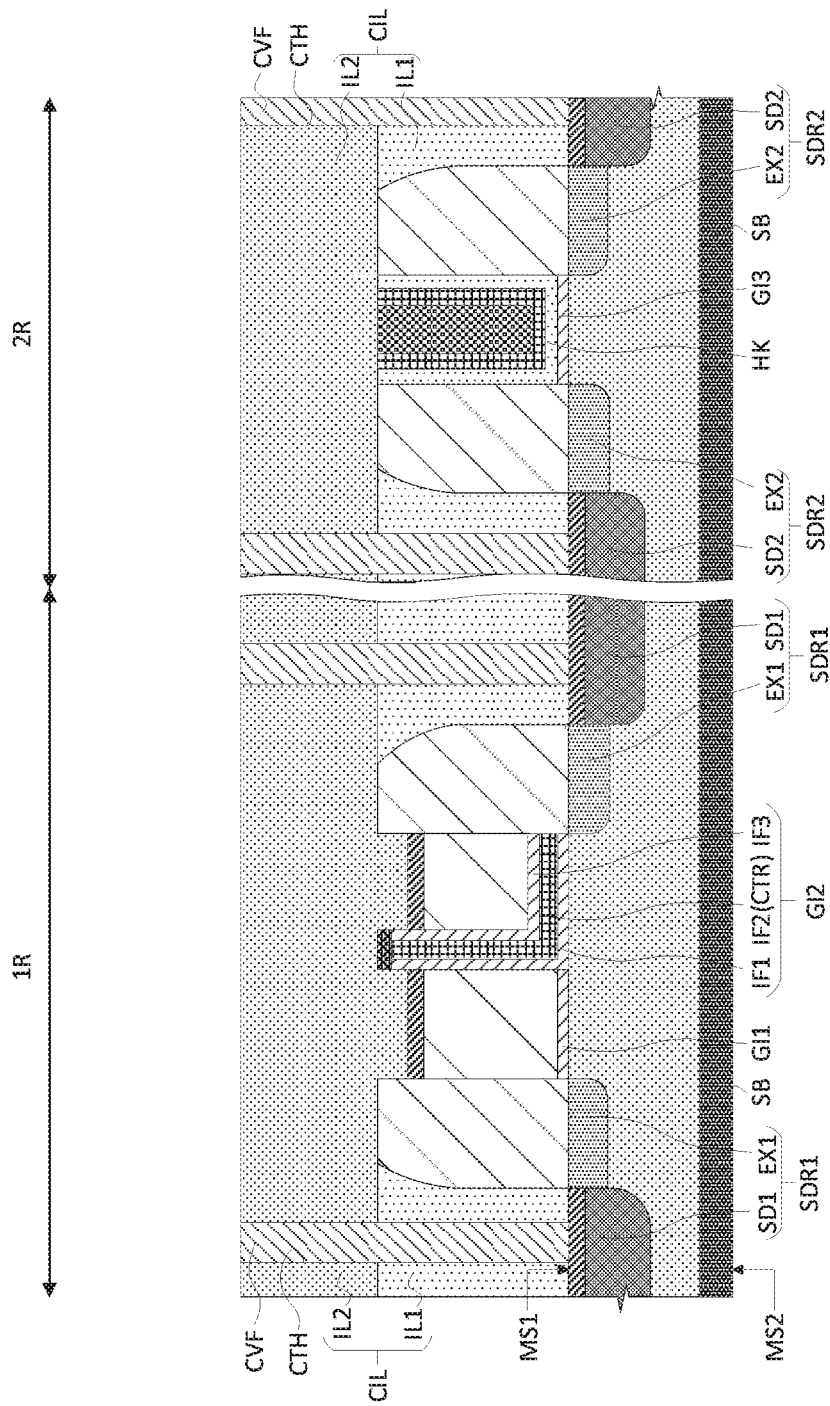
FIG. 13 is a main portion cross-section view during the manufacturing process of the semiconductor device following FIG. 12.

Next, as shown in FIG. 13, a contact hole CTH that penetrates the contact interlayer insulating layer CIL composed of the interlayer insulating film IL1 formed on the semiconductor substrate SB and the interlayer insulating film IL2 formed on the interlayer insulating film IL1 is formed in the contact interlayer insulating layer CIL so as to reach the main surface MS1 of the semiconductor substrate SB. Thereafter, a conductive member such as tungsten (W) is buried in the formed contact hole CTH. As a result, contact plugs CVF electrically connected to the silicide layers SL1 formed in the respective semiconductor regions SDR1, SDR2, specifically, the respective diffusion regions SD1, SD2 comprising the respective semiconductor regions SDR1, SDR2, are formed in the contact holes CTH. Before forming the contact hole CTH, an insulating film serving as an etching stopper film may be formed on the main surface MS1 of the semiconductor substrate SB so as to cover the respective semiconductor regions SDR1, SDR2.

13. Forming Multi-Wiring Layer

Next, an interlayer insulating film IL3 formed on the interlayer insulating film IL2 is formed on the contact interlayer insulating film CIL, specifically, the interlayer insulating film IL2, so as to cover the wiring M1 and further the wiring M1. The wiring M1 and the interlayer insulating film IL3 are alternately stacked on the contact interlayer insulating layer CIL, thereby forming a multilayered wiring layer FNL.

<Effects of Method of Manufacturing Semiconductor Device of Present Embodiment>

As described above, in the present embodiment, after the polishing step (step S5) shown in FIG. 1 is performed (more specifically, after the polishing step and before the silicide layers SL2 are formed on the gate electrodes GE1, GE2 exposed by the polishing step), a part of each gate electrode GE1, GE2 is removed so that the upper surface of each gate electrode GE1, GE2 is located closer to the main surface MS1 of the semiconductor substrate SB than the damaged region DMG formed on the gate insulating film GI2. Therefore, even if the above-described operations such as "write", "read" and "erase" are performed on the manufactured semiconductor device SMD1 (in particular, the operation in which the difference between the value of the voltage Vcg applied to the control gate CG1 shown in FIGS. 14 and 17 and the value of the voltage Vmg applied to the memory gate electrode MG1 shown in FIGS. 14 and 17 is large) is performed, it is possible to suppress the occurrence of a short-circuit defect between the gate electrode GE1 serving as the control gate CG1 and the gate electrode GE2 serving as the memory gate electrode MG1.

Further, in present embodiment, when the etching back process (step 7) of the gate electrode shown in FIG. 1 is performed, the etching amount (removal amount) of each gate electrode GE1, GE2 to be etched (removed) in this etching back process is made smaller than half the thickness of each gate electrode GE1, GE2 after the polishing process (step S5) shown in FIG. 1 and before the etching back of each gate electrode GE1, GE2 is performed. Therefore, the parasitic resistances of the respective gate electrodes GE1, GE2 can be suppressed from increasing. Even if the silicide layers SL2 are formed on the respective gate electrodes GE1, GE2 as in present embodiment, it is possible to avoid silicidation of all the gate electrodes GE1, GE2.

As a countermeasure against the short-circuit defect described above, the present inventor has also considered using a polishing condition under which all the damaged regions DMG are removed when the polishing step S5 is performed. However, in this case, each gate electrode is polished more than necessary. That is, the thickness of the gate electrode becomes thinner than a desired thickness, and as a result, the parasitic resistance of the gate electrode becomes high. Therefore, the present inventors have further considered that, when forming the gate electrode in the gate electrode forming step (step S2) shown in FIG. 1, the film thickness (height) of the gate electrode is made larger (higher) than a desired thickness. However, in this case, after the material comprising the gate electrode is patterned, the aspect ratio of the patterned gate electrode becomes too large, and as a result, the patterned gate electrode may fall down.

In present embodiment, as described above, after the polishing process (step S5) shown in FIG. 1 is performed and before the silicide layers SL2 are formed on the gate electrodes GE1, GE2 exposed by the polishing process, the gate electrodes are etched back (step 7) based on the polishing condition (polishing amounts, polishing times, etc.) as described above. Therefore, not only the short-circuit defect between the two gate electrodes GE1, GE2 comprising the memory cell MC1 but also the parasitic resistances of the two gate electrodes GE1, GE2 can be suppressed from increasing.

In the present embodiment, the etch-back process (step 7) of the gate electrode shown in FIG. 1 is performed after the replacement process (step 6) shown in FIG. 1. That is, when the gate electrode GE3 made of polysilicon formed in the peripheral circuit forming region 2R is replaced with the gate electrode GE made of metallic, the upper surface (polished surface, exposed surface) of the interlayer insulating film IL1, the sidewall spacer SW1, each gate electrode GE1, GE2, and each gate insulating film GI2 located in the memory cell forming region 1R are located at substantially the same height as each other. In other words, when the replacement step 6 is performed, the surfaces of the memory cell forming regions 1R are flat. Therefore, it is easy to form masks (not shown) to be formed in the memory cell forming area 1R when performing the replacement process (Step 6). That is, when the used mask is removed, it is possible to suppress the mask from unintentionally remaining in the memory cell forming area 1R.

MODIFIED EXAMPLE OF PRESENT EMBODIMENT

Next, the modified example of present embodiment will be described.

Modified Example 1

Figure 15:
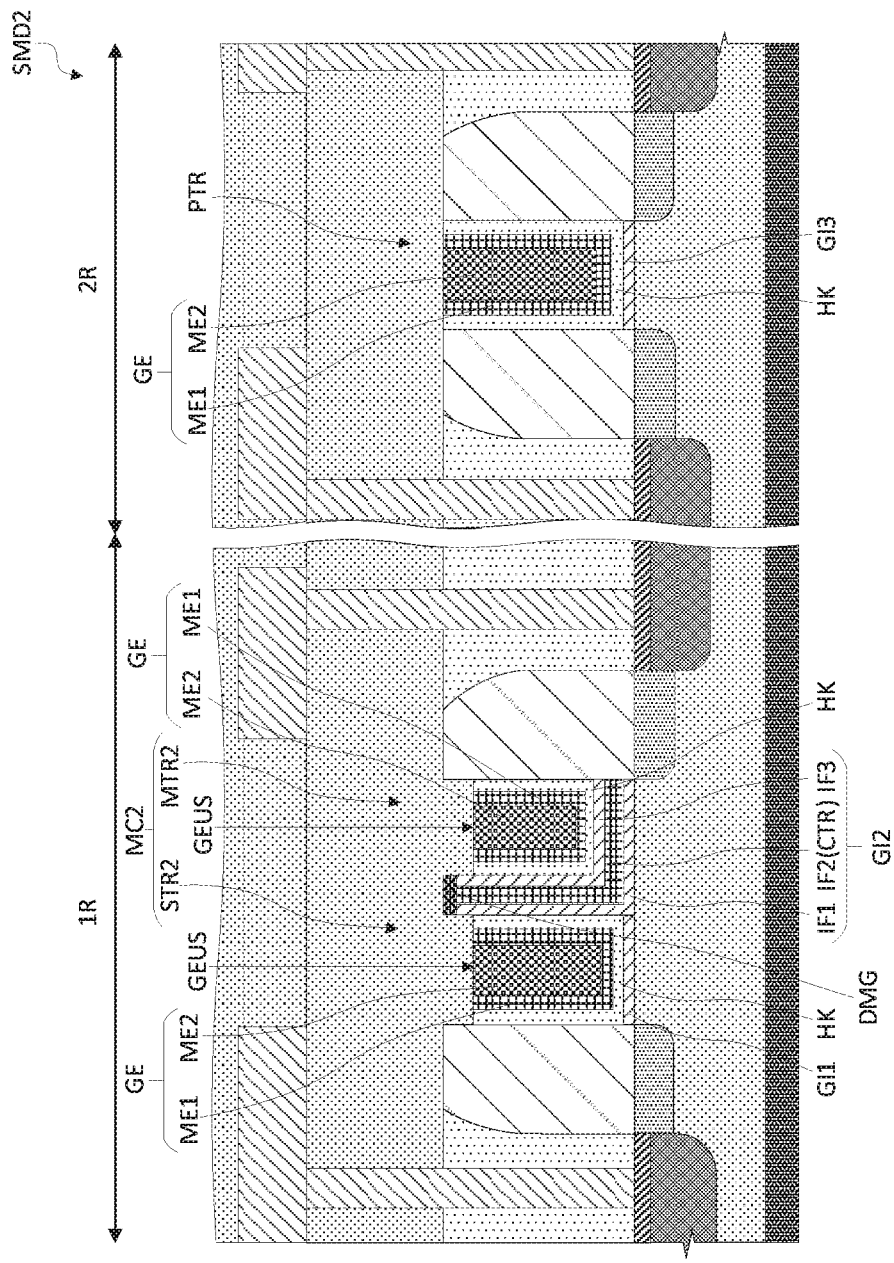
FIG. 15 is a main portion cross-section view of the semiconductor device of according to modified example 1.

In the present embodiment, the gate electrodes GE1, GE2 of the field-effect transistors STR1, PTR1 comprising the memory cells MC1 formed in the memory cell forming regions 1R are not replaced with gate electrodes made of metals. However, like the gate electrode GE of the field-effect transistor PTR formed in the peripheral-circuit forming area 2R, the gate electrodes GE1, GE2 of the memory cells MC1 may be replaced with metallic gate electrodes. That is, the semiconductor device SMD2 in which the memory cell MC2 including the control transistor STR2 having the gate electrode GE having the same configuration as the gate electrode GE of the field effect transistor PTR and the memory transistor MTR2 having the gate electrode GE having the same configuration as the gate electrode GE of the field effect transistor PTR is formed in the memory cell forming area 1R may be used. This makes it possible to provide the semiconductor device SMD2 which can cope with further miniaturization. Also in this first modified example, as shown in FIG. 15, an etch-back process is performed on each gate electrode GE4, GE5 so that the upper surface of each replaced gate electrode GE4, GE5 is located closer to the main surface MS1 of the semiconductor substrate SB than the damaged region DMG formed in the gate insulating film GI2. This suppresses the occurrence of the above-described short-circuit defect.

Modified Example 2

In addition, in the present embodiment, it has been described that a part of the gate electrodes is removed by wet etching in the etching-back step S7 of the gate electrodes. However, a part of each gate electrode may be removed by dry etching. In dry etching, plasma is used, so that a new damaged region may be formed on the gate insulating film GI2 when removing a part of the gate electrodes. Therefore, in the etching-back process of the gate electrode (step S7), it is preferable to use wet etching as in the present embodiment (step S7).

Modified Example 3

In the present embodiment, a memory cell MC1 having a semiconductor region SDR1 composed of an extension region EX1 covered with an LDD-structured memory cell MC1, i.e., a sidewall spacer SW1, and a diffusion region SD1 not covered with a sidewall spacer SW1 has been described. However, the memory cell may not include the extension regions EX1 and the sidewall spacers SW1. In this case, after the above-mentioned "2. gate electrode forming step" is performed, the above-mentioned "3. extension region forming step" and the above-mentioned "4. sidewall spacer forming step" are not performed, and the above-mentioned "5. diffusion region forming step" is performed. Alternatively, the memory cell may not include the sidewall spacer SW1 and the diffused region SD1. In this case, after the above-mentioned "3. extension region forming step" is performed, the above-mentioned "4. sidewall spacer forming step" and the above-mentioned "5. diffusion region forming step" are not performed, and the above-mentioned "6. interlayer insulating film forming step" is performed. Similarly, the field effect transistor PTR may be a field effect transistor having neither the extension region EX2 nor the sidewall spacer SW2 nor a field effect transistor having neither the sidewall spacer SW2 nor the diffused region SD2. On the other hand, in order to realize the miniaturization of the semiconductor device, it is preferable to adopt an LDD structure having an extension region EX1, EX2 and a diffused region SD1, SD2, such as the LDD structure of present embodiment.

Modified Example 4

In the present embodiment, a silicide layer SL1 is formed in each of the semiconductor regions SDR1, SDR2, and a silicide layer SL2 is formed in each of the gate electrodes GE1, GE2. However, the silicide layers SL1, SL2 may not be formed.

Modified Example 5

Further, in the present embodiment, it has been described that the gate insulating film GI2 having the charge-storage regions CTR has an insulating film IF1 made of silicon oxide, an insulating film IF2 made of silicon nitride, and an insulating film IF3 made of silicon oxide. However, the insulating film IF2 serving as the charge-storage area CTR is not limited to silicon nitride, and may be an insulating film made of hafnium silicate (HfSiO). The insulating film IF3 formed on the insulating film IF2 serving as the charge-storage area CTR is not limited to silicon oxide, and may be an insulating film made of alumina ($Al_2O_3$).

The invention made by the present inventor has been described above in detail based on the embodiment, but the present invention is not limited to the embodiment described above, and it is needless to say that various modifications can be made without departing from the gist thereof.

For example, although various modified examples have been described above, some or all of each modified example described above may be applied in conjunction with each other within a scope consistent with the gist described above for each modified example.

What is claimed is:

1. A method of manufacturing a semiconductor device, comprising the steps of:
    (a) providing a semiconductor substrate including a first region and a second region, and having a first main surface;
    (b) after the step of (a), 1) forming a first gate electrode on the first main surface of the semiconductor substrate in the first region via a first gate insulating film, 2) forming a second gate electrode on each of the first main surface of the semiconductor substrate in the first region and a side surface of the first gate electrode via a second gate insulating film, and 3) forming a third gate electrode on the first main surface of the semiconductor substrate in the second region via a third gate insulating film,
    wherein the second gate insulating film has a charge storage region,
    wherein the second gate insulating film includes a first portion located between the second gate electrode and the semiconductor substrate, and a second portion located between the second gate electrode and the first gate electrode, and
    wherein each of the first gate electrode, the second gate electrode, and the third gate electrode is comprised of a first material;
    (c) after the step of (b), performing ion implanting a first impurity of a first conductivity type into the semiconductor substrate from a first main surface side of the semiconductor substrate, thereby 1) forming a first semiconductor region at a portion of the semiconductor substrate in the first region, which is exposed from the first gate electrode, the second gate insulating film, and the second gate electrode, 2) forming a second semiconductor region at a portion of the semiconductor substrate in the second region, which is exposed from the third gate electrode, and 3) forming a damaged region at an upper surface of the second portion of the second insulating film such that the damaged region is exposed from each of the first gate electrode and the second gate electrode;
    (d) after the step of (c), forming a first interlayer insulating film on the first main surface of the semiconductor substrate such that the first gate electrode, the second gate electrode and the third gate electrode are covered with the first interlayer insulating film;
    (e) after the step of (d), polishing the first interlayer insulating film such that a part of each of the first gate electrode, the second gate electrode and the third gate electrode is exposed from the first interlayer insulating film;
    (f) after the step of (e), replacing the first material of the third gate electrode with a second material, wherein the second material which differs from the first material; and
    (g) after the step of (f), removing, by etching, a part of each of the first gate electrode and the second gate electrode such that, in cross-section view, an upper surface of each of the first gate electrode and the second gate electrode, which is exposed from the first interlayer insulating film, is closer to the first main surface of the semiconductor substrate than the damaged region at the second portion of the second insulating film.

2. The method according to claim 1, after the step of (c) and before the step of (d), further comprising the steps of:
(h) forming a first sidewall spacer on the semiconductor substrate in the first region so as to sandwich the first gate electrode, the second gate insulating film and the second gate electrode in cross-section view, and forming a second sidewall spacer on the semiconductor substrate in the second region so as to sandwich the third gate electrode in cross-section view; and
(i) after the step of (h), by ion implanting a second impurity of the first conductivity type into the semiconductor substrate from the first main surface side of the semiconductor substrate, forming a third semiconductor region at a portion of the semiconductor substrate in the first region, which is exposed from the first sidewall spacer, the first gate electrode, the second gate insulating film and the second gate electrode, and forming a fourth semiconductor region at a portion of the semiconductor substrate in the second region, which is exposed from the second sidewall spacer and the third gate electrode,
wherein each of the first impurity and the second impurity is a third material which is the same as each other,
wherein a concentration of the second impurity of each of the third semiconductor region and the fourth semiconductor region is higher than a concentration of the first impurity of each of the first semiconductor region and the second semiconductor region, and
wherein, in the step of (g), the part of each of the first gate electrode and the second gate electrode is removed such that the upper surface of each of the first gate electrode and the second gate electrode, which are exposed from the first interlayer insulating film, is located closer than the damaged region, that is formed by performing the step of (i), to the first main surface of the semiconductor substrate in cross-section view.

3. The method according to claim 2, after the step of (g), further comprising the step of:
(j) performing silicidation of the upper surface of each of the first gate electrode and the second gate electrode,
wherein a thickness of the part of each of the first gate electrode and the second gate electrode, which is to be removed in the step of (g), is greater than a thickness of the damaged region after the step of (e), and
wherein the thickness of the part of each of the first gate electrode and the second gate electrode, which is to be removed in the step of (g), is less than a half thickness of each of the first gate electrode and the second gate electrode after the step of (e) and before the step of (g).

4. The method according to claim 3,
wherein a thickness of the damaged region formed by performing the step of (c) is 10 nm through 15 nm,
wherein a thickness of the damaged region formed by performing the step of (i) is 20 nm through 25 nm,
wherein a thickness of the damaged region after the step of (e) is 5 nm through 15 nm,
wherein a thickness of each of the first gate electrode and the second gate electrode, after the step of (e), is 50 nm through 100 nm, and
wherein a thickness of a silicide layer to be formed in each of the first gate electrode and the second gate electrode by performing the step of (j) is 10 nm through 20 nm.

5. The method according to claim 4, wherein, in the step of (g), the part of each of the first gate electrode and the second gate electrode is removed such that a thickness of each of the first gate electrode and the second gate electrode after the step (j) is greater than a thickness of the silicide layer formed by the step of (j).

6. The method according to claim 5, wherein a concentration of the third material in the damaged region is two orders of magnitude higher than a concentration of the third material in a portion, other than the damaged region, of the second portion of the second gate insulating film.

7. The method according to claim 6, wherein the second gate insulating film is comprised of:
a first insulating layer formed on the first main surface of the semiconductor substrate in the first region, and comprised of silicon oxide,
a second insulating layer formed on the first insulating layer, and comprised of silicon nitride, and
a third insulating layer formed on the second insulating layer, and comprised of silicon oxide.

8. The method according to claim 5, after the step of (j), further comprising the steps of:
(k) forming a second interlayer insulating film on the first main surface of the semiconductor substrate such that the first gate electrode, the second gate electrode, the third gate electrode and the first interlayer insulating film are covered with the second interlayer insulating film;
(l) after the step of (k), forming a contact hole penetrating through each of the first interlayer insulating film and the second interlayer insulating film so as to reach the first main surface of the semiconductor substrate, and embedding the contact hole with a conductive material; and
(m) after the step of (l), forming a multi wiring layer on the second interlayer insulating film.

9. The method according to claim 1, wherein, in the step of (g), the part of each of the first gate electrode and the second gate electrode is removed by wet etching.

10. The method according to claim 1, wherein, in the step of (f), the first material of each of the first gate electrode, the second gate electrode and the third gate electrode is replaced with the second material which differs from the first material.

11. The method according to claim 1, after the step of (b) and before the step of (c), further comprising the steps of:
(h) by ion implanting a second impurity of the first conductivity type into the semiconductor substrate from the first main surface side of the semiconductor substrate, forming a third semiconductor region at a portion of the semiconductor substrate in the first region, which is exposed from the first gate electrode, the second gate insulating film and the second gate electrode, and forming a fourth semiconductor region at a portion of the semiconductor substrate in the second region, which is exposed from the third gate electrode; and
(i) after the step of (h), forming a first sidewall spacer on the semiconductor substrate in the first region so as to sandwich the first gate electrode, the second gate insulating film and the second gate electrode in cross-section view, and forming a second sidewall spacer on the semiconductor substrate in the second region so as to sandwich the third gate electrode in cross-section view,
wherein, in the step of (c), by ion implanting the first impurity of the first conductivity type into the semiconductor substrate from the first main surface side of the semiconductor substrate, the first semiconductor region is formed at the portion of the semiconductor substrate in the first region, which is exposed from the first sidewall spacer, the first gate electrode, the second gate insulating film and the second gate electrode, and the second semiconductor region is formed at the portion of the semiconductor substrate in the second region, which is exposed from the second sidewall spacer and the third gate electrode, wherein each of the first impurity and the second impurity is a third material which is the same as each other, and wherein a concentration of the second impurity of each of the third semiconductor region and the fourth semiconductor region is lower than a concentration of the first impurity of each of the first semiconductor region and the second semiconductor region.

12. The method according to claim 11, after the step of (g), further comprising the step of:
(j) performing silicidation of the upper surface of each of the first gate electrode and the second gate electrode,
wherein a thickness of the part of each of the first gate electrode and the second gate electrode, which is to be removed in the step of (g), is greater than a thickness of the damaged region after the step of (e), and
wherein the thickness of the part of each of the first gate electrode and the second gate electrode, which is to be removed in the step of (g), is less than a half thickness of each of the first gate electrode and the second gate electrode after the step of (e) and before the step of (g).

13. The method according to claim 12,
wherein a thickness of the damaged region formed by performing the step of (h) is 10 nm through 15 nm,
wherein a thickness of the damaged region formed by performing the step of (c) is 20 nm through 25 nm,
wherein a thickness of the damaged region after the step of (e) is 5 nm through 15 nm,
wherein a thickness of each of the first gate electrode and the second gate electrode, after the step of (e), is 50 nm through 100 nm, and wherein a thickness of a silicide layer to be formed in each of the first gate electrode and the second gate electrode by performing the step of (j) is 10 nm through 20 nm.

14. The method according to claim 13, wherein, in the step of (g), the part of each of the first gate electrode and the second gate electrode is removed such that a thickness of each of the first gate electrode and the second gate electrode after the step (j) is greater than a thickness of the silicide layer formed by the step of (j).

15. The method according to claim 14, wherein a concentration of the third material in the damaged region is two orders of magnitude higher than a concentration of the third material in a portion, other than the damaged region, of the second portion of the second gate insulating film.

16. The method according to claim 15, wherein the second gate insulating film is comprised of:
a first insulating layer formed on the first main surface of the semiconductor substrate in the first region, and comprised of silicon oxide,
a second insulating layer formed on the first insulating layer, and comprised of silicon nitride, and
a third insulating layer formed on the second insulating layer, and comprised of silicon oxide.

17. The method according to claim 14, after the step of (j), further comprising the steps of:
(k) forming a second interlayer insulating film on the first main surface of the semiconductor substrate such that the first gate electrode, the second gate electrode, the third gate electrode and the first interlayer insulating film are covered with the second interlayer insulating film;
(l) after the step of (k), forming a contact hole penetrating through each of the first interlayer insulating film and the second interlayer insulating film so as to reach the first main surface of the semiconductor substrate, and embedding the contact hole with a conductive material; and
(m) after the step of (1), forming a multi wiring layer on the second interlayer insulating film.

* * * * *